United States Patent
Iizumi et al.

(10) Patent No.: US 9,000,419 B2
(45) Date of Patent: Apr. 7, 2015

(54) ORGANIC ELECTROLUMINESCENCE ELEMENT

(75) Inventors: Yasuhiro Iizumi, Tokyo-to (JP); Atsushi Oda, Yamagata-ken (JP); Junji Kido, Yamagata-ken (JP); Toshitaka Mori, Yamagata-ken (JP)

(73) Assignees: Dai Nippon Printing Co., Ltd, Tokyo-to (JP); Yamagata Promotional Organization for Industrial Technology, Yamagata-shi (JP)

( * ) Notice: Subject to any disclaimer, the term of this patent is extended or adjusted under 35 U.S.C. 154(b) by 0 days.

(21) Appl. No.: 12/527,224

(22) PCT Filed: Feb. 6, 2008

(86) PCT No.: PCT/JP2008/051924
§ 371 (c)(1),
(2), (4) Date: Aug. 14, 2009

(87) PCT Pub. No.: WO2008/102644
PCT Pub. Date: Aug. 28, 2008

(65) Prior Publication Data
US 2010/0096622 A1    Apr. 22, 2010

(30) Foreign Application Priority Data
Feb. 19, 2007    (JP) .................. 2007-038600

(51) Int. Cl.
*H01L 29/08* (2006.01)
*H01L 51/10* (2006.01)
(Continued)

(52) U.S. Cl.
CPC ......... *H01L 51/5012* (2013.01); *H01L 51/0054* (2013.01); *H01L 51/0056* (2013.01);
(Continued)

(58) Field of Classification Search
USPC ................. 257/40, E51.018, E51.026, 72, 59
See application file for complete search history.

(56) References Cited

U.S. PATENT DOCUMENTS

| | | | |
|---|---|---|---|
| 5,350,459 A | * | 9/1994 | Suzuki et al. .................. 136/263 |
| 2004/0247933 A1 | * | 12/2004 | Thoms .......................... 428/690 |

(Continued)

FOREIGN PATENT DOCUMENTS

| | | |
|---|---|---|
| CN | 1582073 A | 2/2005 |
| JP | 10-270171 A | 10/1998 |

(Continued)

OTHER PUBLICATIONS

International Search Report: PCT/JP2008/051924.
(Continued)

*Primary Examiner* — Ori Nadav
(74) *Attorney, Agent, or Firm* — Ladas & Parry LLP

(57) ABSTRACT

An organic EL element which has no layer that prevents penetration of holes and electrons to the counter electrode. The organic EL element includes: an anode, a hole injecting and transporting layer formed on the anode, a light emitting layer formed on the hole injecting and transporting layer, an electron injecting and transporting layer formed on the light emitting layer, and a cathode formed on the electron injecting and transporting layer. $Ip_2 \geq Ip_3$ is established when an ionization potential of a constituent material for the light emitting layer is $Ip_2$ and an ionization potential of a constituent material for the electron injecting and transporting layer is $Ip_3$. $Ea_1 \geq Ea_2$ is established when an electron affinity of a constituent material for the hole injecting and transporting layer is $Ea_1$ and an electron affinity of the constituent material for the light emitting layer is $Ea_2$.

20 Claims, 13 Drawing Sheets

(51) Int. Cl.
*H01L 29/04* (2006.01)
*H01L 51/50* (2006.01)
*H01L 51/52* (2006.01)
*H01L 51/00* (2006.01)

(52) U.S. Cl.
CPC .......... *H01L51/006* (2013.01); *H01L 51/0077* (2013.01); *H01L 51/0081* (2013.01); *H01L 51/0085* (2013.01); *H01L 51/5048* (2013.01); *H01L 51/5052* (2013.01); *H01L 51/5278* (2013.01); *H01L 2251/552* (2013.01)

(56) References Cited

U.S. PATENT DOCUMENTS

| | | |
|---|---|---|
| 2006/0008740 A1 | 1/2006 | Kido et al. |
| 2006/0057427 A1 | 3/2006 | Tsukahara et al. |
| 2006/0131562 A1 | 6/2006 | Li |
| 2006/0263637 A1* | 11/2006 | Ohsawa et al. ............... 428/690 |
| 2007/0181887 A1* | 8/2007 | Kijima et al. ................. 257/79 |

FOREIGN PATENT DOCUMENTS

| | | |
|---|---|---|
| JP | 10-270172 A | 10/1998 |
| JP | 11-251067 A | 9/1999 |
| JP | 2000-315581 A | 11/2000 |
| JP | 2002-260861 A | 9/2002 |
| JP | 2004-022434 A | 1/2004 |
| JP | 2004-363103 A | 12/2004 |
| JP | 2005-108730 A | 4/2005 |
| JP | 2005-255986 A | 9/2005 |
| JP | 2006-041395 A | 2/2006 |
| JP | 2006-352106 A | 12/2006 |
| TW | 200626005 A | 8/2009 |
| WO | 2005/119805 A2 | 12/2005 |

OTHER PUBLICATIONS

T Maindron, et al; "highly electroluminescent devices made with a conveniently synthesized triazole-triphenylamine derivative", Thin Solid Films, Elseview-Sequoia S.A. Lausanne, CH LNKD-DOI: 10.1016/J.TSF.2004.01.119, vol. 466, No. 1-2, Nov. 1, 2004, pp. 209-216, XP004552753, ISSN: 0040-6090, p. 209.

Paolo Losio, et al; Singlet excimer electroluminescence within N,N'-di-1-naphthalenyl-N,N'-diphenyl-[1,1'-biphenyl]-4,4'-diamine based diodes, Applied Physics Letters, AIP, American Institute of Physics, Melville, NY, US LNKD-DOI:10.1063/1.2236217, vol. 89, No. 4, Jul. 27, 2006, pp. 41914-041914, XP012088112, ISSN: 0003-6951, p. 3.

European Search Report: EP 08 70 4495.

* cited by examiner

ORGANIC ELECTROLUMINESCENCE ELEMENT

TECHNICAL FIELD

The present invention relates to an organic electroluminescence element having a structure wherein a hole injecting and transporting layer, a light emitting layer, an electron injecting and transporting layer are sequentially laminated between an anode and a cathode.

BACKGROUND ART

The organic electroluminescence element (hereinafter, "electroluminescence" may be occasionally abbreviated as "EL") generally has a multilayer structure wherein plural layers are laminated using materials having a hole or electron injecting, transporting and blocking functions in order to achieve long-lasting life and high efficiency. Further, the organic EL element having the multilayer structure generally has a blocking layer, which prevents penetration of holes and electrons to the counter electrode, provided between an electrode and a light emitting layer to efficiently block holes and electrons in the light emitting layer.

However, there is a concern with the organic EL elements having the multilayer structure that deterioration caused during its driving at interfaces of the respective layers will lower the luminous efficiency or will deteriorate the elements to lower its luminance. In particular, charges are easily builtup at interfaces with the organic EL element comprising a blocking layer so that deterioration is easily caused at interfaces and the luminance deterioration of the element is a concern.

In order to restrain the deterioration from causing at interfaces of the respective layers during driving, methods to arrange materials used for the hole injecting and transporting layer and the electron injecting and transporting layer are proposed.

For example, the Patent Document 1 discloses a method to improve the injection properties of holes from an anode and the injection properties of electrons from the cathode, wherein an organic semiconductor layer (hole injecting and transporting layer or electron injecting and transporting layer) is constituted from either of the followings: an organic compound and an oxidizing dopant, an organic compound and a reducing dopant, or an organic compound and a conducting fine particle.

However, the organic EL element of the Patent Document 1 has the above-mentioned concerns of lowering in the luminous efficiency of causing and the deterioration of elements because an inorganic charge blocking layer (blocking layer) is provided between the organic semiconductor layer (hole injecting and transporting layer or electron injecting and transporting layer) and the organic light emitting layer.

Further for example, the Patent Document 2 discloses a method of doping an electron accepting dopant to an organic compound layer contacting to an anode, and an object thereof is to lower the energy barrier caused in injecting holes from the anode to the organic compound layer (hole injecting and transporting layer). Moreover, for example, the Patent Documents 3 and 4 discloses a method of doping an electron donating dopant to an organic compound layer contacting to a cathode, and their respective object is to lower the energy barrier caused in injecting electrons from the cathode to the organic compound layer (electron injecting and transporting layer).

Patent Document 1: Japanese Patent Application Laid-Open (JP-A) No. 2000-315581
Patent Document 2: JP-A No. 11-251067
Patent Document 3: JP-A No. 10-270171
Patent Document 4: JP-A No. 10-270172

DISCLOSURE OF INVENTION

Problems to be Solved by the Invention

However, in order to efficiently restrain the lowering of the luminous efficiency and the causing of deterioration of elements, lowering of the energy barrier caused in injecting holes from the anode and of the energy barrier caused in injecting electrons from cathode are not sufficient. It is effective to make a structure of an EL element as such that it does not comprise a layer which prevents penetration of holes and electrons to the counter electrode.

In view of the above situation, the present invention was achieved and it is an object of the present invention to provide a highly efficient and long-lasting organic EL element which comprises no layer that prevents penetration of holes and electrons to the counter electrode.

Means for Solving the Problems

In view of the above-mentioned situation, the inventors of the present invention: respectively set the ionization potential of a constituent material for an electron injecting and transporting layer and the electron affinity of a constituent material for the hole injecting and transporting layer to such, against the ionization potential and the electron affinity of a constituent material for the light emitting layer, that they do not prevent penetration of holes and electrons to a counter electrode; appropriately selected materials used for each of the hole injecting and transporting layer, electron injecting and transporting layer, and light emitting layer; and optimized the structure of an EL element. Thereby, the present inventors found out that an organic EL element having high-efficiency and long-lasting lifetime compare to those of current organic EL elements can be obtained and attained the present invention.

Here, the electron affinity denotes the energy difference between an energy E(o) of a ground state molecule and an anion state energy E(−) having a minus charge, and it is expressed as "A". An electron affinity in gas condition (single molecule) is expressed by "Ag" by adding "g", and an electron affinity in solid condition (amorphous) is expressed by "As" by adding "s".

Further, the ionization potential denotes the energy difference between an energy E(o) of a ground state molecule and a cationic state energy E(+) having a positive charge, and it is expressed as "I". Similar to the above case of electron affinity, an ionization potential in gas condition (single molecule) is expressed by "Ig" by adding "g", and an ionization potential in solid condition (amorphous) is expressed by "Is" by adding "s".

In gas condition (single molecule), the electron affinity "Ag" is expressed by a relation: Ag=E(0)−E(−), and the ionization potential "Ig" is expressed by a relation: Ig=E(+)−E(0).

In gas condition, it is difficult to obtain "Ag" and "Ig" by experiments, but they can be obtained by the molecular orbital method calculation. For example, through using the molecular orbital calculation software Gaussian 03™, optimizing a neutral molecular structure by applying a basis function system 6-31g (d) to the B3LYP method; and conducting three sets of energy calculations of positive, negative and neutral charges to the structure by applying a basis function system 6-311g++(d,p) to the B3LYP method, the above-mentioned cationic state energy E(+), energy E(o) of a ground state, and anion state energy E(−) are obtained. Further, when the molecule contains a heavy atom, calculation can be conducting by using ECP to the atom. For example, LANL2DZ can be used for structure optimization and SBKJC VDZ can be used for energy calculation.

In case the subject is in solid condition like a deposited film, when one molecule in the solid substance takes a charge, charge polarization is caused to the surrounding molecules. As the electric field made by the induced dipoles of these surrounding molecules acts to the original molecule taking the charge, the molecule gets this potential, i.e., the electro-chemical potential shift. This energy is normally called the polarization energy "P". Thus, the difference in solid condition and gas (single molecule) condition of the ionization potential and electron affinity is identical to "P". The ionization potential "Is" in solid condition is obtained by measured values provided by measuring a single thin film of the respective materials with the photoelectron or the Photoelectron Yield Spectroscopy. From this value, the polarization energy P+ affecting the positive charge is obtained. The value of $P^+$ is provided by subtracting "Is" from "Ig". Further, in case the subject is in crystal state, the polarization energy P+ affecting the positive charge and the polarization energy P− affecting the negative charge vary depending on the subject properties. Still further, in case the subject is amorphous, alignments of every molecule become random so that the polarization energy P+ affecting the positive charge and the polarization energy P− affecting the negative charge take the same value to holes and electrons as the first-order approximation, and it can be regarded that a relation is established: P+=P−.

Regarding "As", methods to obtain "As" by experiments using the inverse photoemission spectroscopy has been reported, but it is difficult to quantify. In the present invention, P+ is obtained by the measured "Is" and calculated "Ig", and "As" is assumed as establishing a relation: As=Ag+P− using the above-mentioned relation of P+=P−.

As an example, FIG. 1 shows a band diagram of 3-tert-butyl-9,10-di(naphtha-2-yl)anthracene (TBADN). The electron affinity "Ag" (0.82 eV) and the ionization potential "Ig" (6.56 eV) in gas condition (single molecule) are obtained by the above-mentioned quantum chemical calculation. "Is" (5.6 eV) is obtained by a Photoelectron Yield Spectroscopy device AC-2™ manufactured by RIKEN KEIKI CO., LTD. From the difference, As=1.78 eV is obtained by P+=P−=0.96 eV. In the present invention, the value of "As" is obtained in such manner.

The present invention provides an organic EL element comprising: an anode, a hole injecting and transporting layer formed on the anode, a light emitting layer formed on the hole injecting and transporting layer, an electron injecting and transporting layer formed on the light emitting layer, and a cathode formed on the electron injecting and transporting layer, characterized in that a relation of $Ip_2 \geq Ip_3$ is established when an ionization potential of a constituent material for the light emitting layer is $Ip_2$ and an ionization potential of a constituent material for the electron injecting and transporting layer is $Ip_3$, and characterized in that a relation of $Ea_1 \geq Ea_2$ is established when an electron affinity of a constituent material for the hole injecting and transporting layer is $Ea_1$ and an electron affinity of the constituent material for the light emitting layer is $Ea_2$.

In the present invention, since the relation between the ionization potential of the constituent material for the electron injecting and transporting layer and the ionization potential of the constituent material for the light emitting layer is $Ip_2 \geq Ip_3$, and the relation between the electron affinity of the constituent material for the hole injecting and transporting layer and the electron affinity of the constituent material for the light emitting layer is $Ea_1 \geq Ea_2$, buildup of charges caused during the driving of the EL element at interfaces of the respective hole injecting and transporting layer, light emitting layer and electron injecting and transporting layer are avoided and deterioration can be restrained. Thereby, a highly efficient and long-lasting organic EL element can be obtained.

Further, the present invention provides an organic EL element comprising: plural light emitting units, which respectively having a hole injecting and transporting layer, a light emitting layer and an electron injecting and transporting layer sequentially laminated, between an anode and a cathode facing each other; and a charge generating layer formed between adjacent light emitting units, characterized in that a relation of $Ip_2 \geq Ip_3$ is established when an ionization potential of a constituent material for the light emitting layer is $Ip_2$ and an ionization potential of a constituent material for the electron injecting and transporting layer is $Ip_3$, and characterized in that a relation of $Ea_1 \geq Ea_2$ is established when an electron affinity of a constituent material for the hole injecting and transporting layer is $Ea_1$ and an electron affinity of the constituent material for the light emitting layer is $Ea_2$.

In the present invention, as explained above, since the relation between the ionization potential of the constituent material for the electron injecting and transporting layer and the ionization potential of the constituent material for the light emitting layer is $Ip_2 \geq Ip_3$, and the relation between the electron affinity of the constituent material for the hole injecting and transporting layer and the electron affinity of the constituent material for the light emitting layer is $Ea_1 \geq Ea_2$, deterioration caused during the driving of the EL element at interfaces of the respective hole injecting and transporting layer, light emitting layer, and electron injecting and transporting layer can be avoided. Further, since plural light emitting units are formed between an anode and a cathode via the charge generating layer, high luminance can be realized while maintaining the current density relatively low. Accordingly, a highly efficient, high-luminance and long-lasting organic EL element can be obtained.

In the present invention, a relation of $Ip_1 < Ip_2$ is preferably established when an ionization potential of the constituent material for the hole injecting and transporting layer is $Ip_1$. By having some energy barrier during hole transportation from the hole injecting and transporting layer to the light emitting layer, hole injection from the light emitting layer can be controlled and thereby luminous efficiency can be improved.

Further in the present invention, a relation of $Ea_2 < Ea_3$ is preferably established when an electron affinity of the constituent material for the electron injecting and transporting layer is $Ea_3$. By having some energy barrier during electron transportation from the electron injecting and transporting layer to the light emitting layer, the electron injection to the light emitting layer can be controlled and thereby luminous efficiency can be improved.

Still further in the present invention, each of the hole injecting and transporting layer and the electron injecting and transporting layer preferably comprises a bipolar material which can transport holes and electrons. By using the bipolar material to the hole injecting and transporting layer and the electron injecting and transporting layer, deterioration of the hole injecting and transporting layer, the light emitting layer, and the electron injecting and transporting layer at their interfaces during the driving of the EL element can be efficiently restrained.

In the above-mentioned case, the bipolar material contained in the hole injecting and transporting layer is preferably identical to the bipolar material contained in the electron injecting and transporting layer. This is because, if these bipolar materials are identical, these layers are less easily deteriorated even if the electron injecting and transporting layer is penetrated by holes or the hole injecting and transporting layer is penetrated by electrons.

Further, in the above-mentioned case, the light emitting layer may comprise a bipolar material which can transport holes and electrons. In such a case, the bipolar material contained in the hole injecting and transporting layer, the bipolar material contained in the electron injecting and transporting layer, and the bipolar material contained in the light emitting layer are preferably identical. As explained above, this is because, if these bipolar materials are identical, these layers are less easily deteriorated even if the electron injecting and transporting layer is penetrated by holes or the hole injecting and transporting layer is penetrated by electrons.

In the present invention, the bipolar material is preferably a distyrylarene derivative, a polyaromatic compound, one of condensed ring aromatic compounds, a carbazole derivative, or a heterocyclic compound. In this case, the bipolar material is preferably 4,4'-bis(2,2-diphenyl-ethene-1-yl)diphenyl (DPVBi), spiro-4,4'-bis(2,2-diphenyl-ethene-1-yl)diphenyl (spiro-DPVBi), 4,4'-bis(carbazole-9-yl)biphenyl (CBP), 2,2', 7,7'-tetrakis(carbazole-9-yl)-9,9'-spiro-bifluorene (spiro-CBP), 4,4''-di(N-carbazole)-2',3',5',6'-tetraphenyl-p-terphenyl (CzTT), 1,3-bis(carbazole-9-yl)-benzene (m-CP), 3-tert-butyl-9,10-di(naphtha-2-yl) anthracene (TBADN), or a compound represented by the below formula (1):

[Chemical Formula 1]

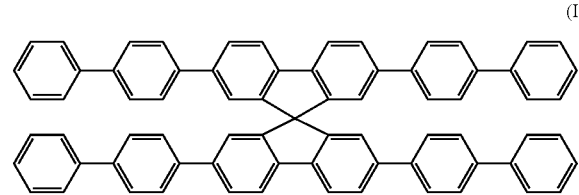

(I)

Further, in the present invention, the hole injecting and transporting layer preferably has a region where an oxidizing dopant is mixed into an organic compound for the hole injecting and transporting layer at an interface to at least the anode or at an interface to at least the anode and the charge generating layer, and the electron injecting and transporting layer preferably has a region where a reducing dopant is mixed into an organic compound for the electron injecting and transporting layer at an interface to at least the cathode or at an interface to at least the cathode and the charge generating layer. Thereby, the hole injecting barrier from the anode to the hole injecting and transporting layer, and the electron injecting barrier from the cathode to the electron injecting and transporting layer can be made small so that it is possible to lower the driving voltage.

In the above-mentioned case, the oxidizing dopant is preferably a metal oxide. At that time, the metal oxide is preferably $MoO_3$ or $V_2O_5$.

Further in the above-mentioned case, the reducing dopant is preferably any one of a metal, a metal compound, or an organometallic complex. At that time, it is more preferable if the metal, the metal compound, or the organometallic complex contains at least a metal selected from the group consisting of an alkali metal, an alkali earth metal and a transition metal comprising a rare-earth metal having a work function of 4.2 eV or less. By doping these to the organic compound for the electron injecting and transporting layer, excellent electron injecting properties can be obtained.

Further in the present invention, a second hole injecting and transporting layer may be formed between the hole injecting and transporting layer and the light emitting layer. At that time, a relation of $Ea_1 \geq Ea_4 \geq Ea_2$ is preferably established when an electron affinity of a constituent material for the second hole injecting and transporting layer is $Ea_4$, and further a relation of $Ip_1 < Ip_4 < Ip_2$ is preferably established when an ionization potential of the constituent material for the second electron injecting and transporting layer is $Ip_4$. By making the relation $Ea_1 \geq Ea_4 \geq Ea_2$, deterioration of the hole injecting and transporting layer, the second hole injecting and transporting layer and the light emitting layer at their interfaces during the driving of an EL element can be restrained. Further, by forming the second hole injecting and transporting layer between the hole injecting and transporting layer and the light emitting layer to make the relation $Ip_1 < Ip_4 < Ip_2$, smooth transportation of holes from the hole injecting and transporting layer to the light emitting layer via the second hole injecting and transporting layer can be realized.

Still further in the present invention, a second electron injecting and transporting layer may be formed between the electron injecting and transporting layer and the light emitting layer. At that time, a relation of $Ip_2 \geq Ip_5 \geq Ip_3$ is preferably established when an ionization potential of a constituent material for the second electron injecting and transporting layer is $Ip_5$, and further a relation of $Ea_2 < Ea_5 < Ea_3$ is preferably established when an electron affinity of the constituent material for the second electron injecting and transporting layer is $Ea_5$. By making the relation $Ip_2 \geq Ip_5 \geq Ip_3$, deterioration of the hole injecting and transporting layer, the second hole injecting and transporting layer and the light emitting layer at their interfaces during the driving of an EL element can be restrained. Further, by forming the second electron injecting and transporting layer between the electron injecting and transporting layer and the light emitting layer to make the relation $Ea_2 < Ea_5 < Ea_3$, smooth transportation of electrons from the electron injecting and transporting layer to the light emitting layer via the second electron injecting and transporting layer can be realized.

Moreover, in the present invention, the light emitting layer preferably comprises a host material and a light emitting dopant, and the light emitting dopant contained in the light emitting layer preferably has distribution in its concentration. By providing the distribution to the light emitting dopant concentration, holes and electrons injected to the light emitting layer can be balanced.

In the present invention, the light emitting layer may comprise the host material and at least two light emitting dopants. For example, by containing the light emitting dopant which facilitates transportation of holes than electrons and the light emitting dopant which facilitates transportation of electrons than holes into the light emitting layer, holes and electrons injected to the light emitting layer can be balanced. Moreover, for example, by further containing the light emitting dopant having excitation energy between the excitation energies of the host material and the light emitting dopant, smooth energy movement is realized.

Effect of the Invention

In the present invention, by setting the relation of the ionization potentials of the respective constituent materials for the electron injecting and transporting layer and the light emitting layer, and the relation of the electron affinities of the respective constituent materials for the hole injecting and transporting layer and the light emitting layer to the predetermined relations respectively, advantageous effects of restraining the deterioration of the hole injecting and transporting layer, the light emitting layer, and the electron injecting and transporting layer at their interfaces caused during driving of the EL element, advancing the high-efficiency and obtaining stable lifetime properties can be attained.

EXPLANATION OF REFERENCES

Figure 1:
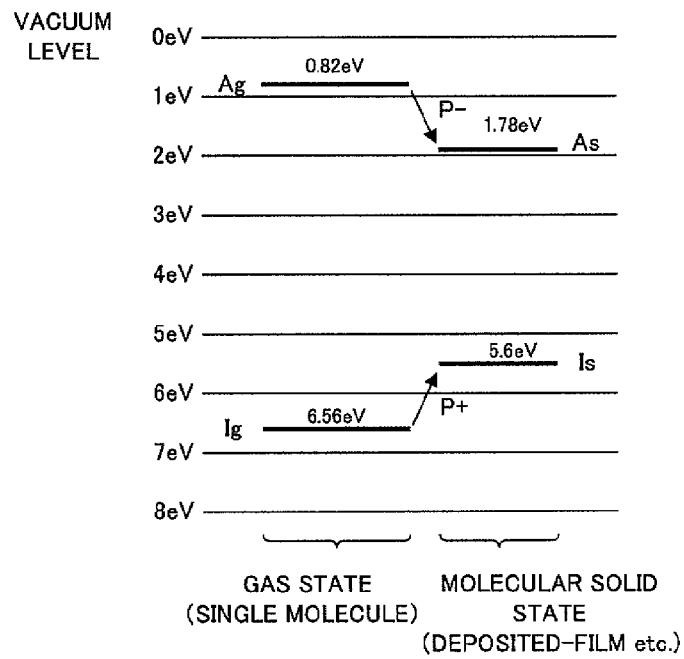
FIG. 1 is a pattern diagram showing a band diagram to explain the ionization potential and the electron affinity.

1 . . . Organic EL element
2 . . . Substrate
3 . . . Anode
4 . . . Hole injecting and transporting layer
5 . . . Light emitting layer
6 . . . Electron injecting and transporting layer
7 . . . Cathode
8 . . . Second hole injecting and transporting layer
9 . . . Second electron injecting and transporting layer
10a, 10b and 10c . . . Light emitting unit
11, 11a and 11b . . . Charge generating layer

BEST MODE FOR CARRYING OUT THE INVENTION

Hereinafter, an organic EL element of the present invention will be explained in detail.

The organic EL element of the present invention can be divided in two embodiments depending on its layer structure. Hereinafter, each embodiment will be explained.

I. First Embodiment

An organic EL element of the first embodiment of the present invention comprises: an anode, a hole injecting and transporting layer formed on the anode, a light emitting layer formed on the hole injecting and transporting layer, an electron injecting and transporting layer formed on the light emitting layer, and a cathode formed on the electron injecting and transporting layer, characterized in that a relation of $Ip_2 \geq Ip_3$ is established when an ionization potential of a constituent material for the light emitting layer is $Ip_2$ and an ionization potential of a constituent material for the electron injecting and transporting layer is $Ip_3$, and characterized in that a relation of $Ea_1 \geq Ea_2$ is established when an electron affinity of a constituent material for the hole injecting and transporting layer is $Ea_1$ and an electron affinity of the constituent material for the light emitting layer is $Ea_2$.

An organic EL element of the present embodiment will be explained with reference to the drawings.

Figure 2:
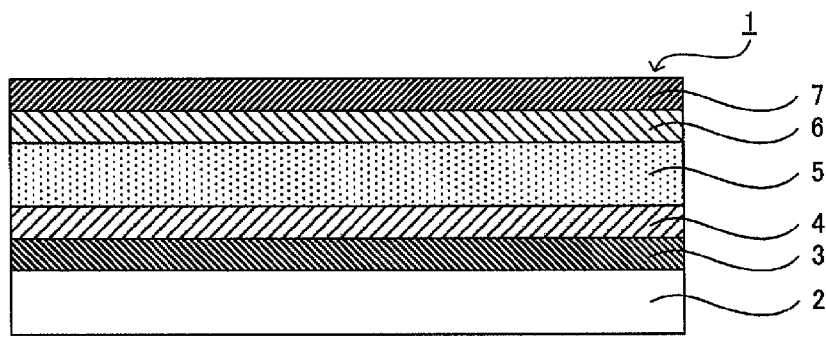
FIG. 2 is a schematic cross-sectional view illustrating one embodiment of the organic EL element of the present invention.
Figure 3:
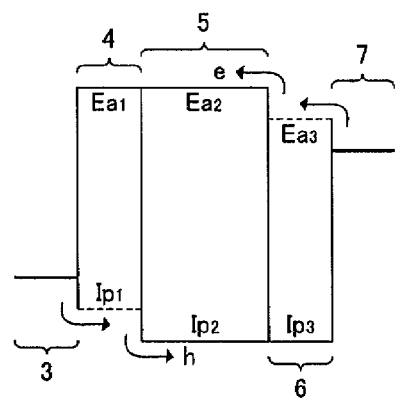
FIG. 3 is a pattern diagram showing one embodiment of the band diagram of the organic EL element of the present invention.
Figure 4:
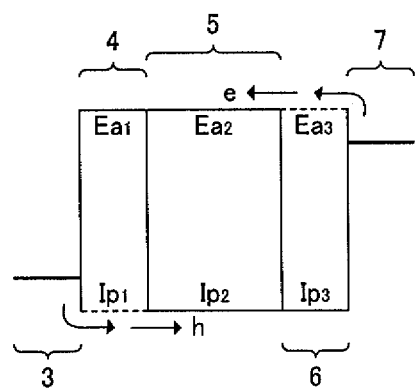
FIG. 4 is a pattern diagram showing another embodiment of the band diagram of the organic EL element of the present invention.

FIG. 2 is a schematic cross-sectional view illustrating one example of the organic EL element of the present embodiment. FIGS. 3 and 4 are each a pattern diagram showing an example of the band diagram of the organic EL element shown in FIG. 2.

As shown in FIG. 2, an organic EL element 1 comprises an anode 3, a hole injecting and transporting layer 4, a light emitting layer 5, an electron injecting and transporting layer 6, and a cathode 7 sequentially laminated on a substrate 2.

In this organic EL element, the relation may be $Ip_1<Ip_2=Ip_3$ as shown in FIG. 3, may be $Ip_1=Ip_2=Ip_3$ as shown in FIG. 4, or may be $Ip_2>Ip_1$ and $Ip_2>Ip_3$ which are not illustrated in the drawings, when the ionization potential of the constituent material for the hole injecting and transporting layer 4 is $Ip_1$, the ionization potential of the constituent material for the light emitting layer 5 is $Ip_2$ and the ionization potential of the constituent material for the electron injecting and transporting layer 6 is $Ip_3$. Further, the relation may be $Ea_1=Ea_2<Ea_3$ as shown in FIG. 3, may be $Ea_1=Ea_2=Ea_3$ as shown in FIG. 4, or may be $Ea_1>Ea_2$ and $Ea_3>Ea_2$ which are not illustrated in the drawings, when the electron affinity of the constituent material for the hole injecting and transporting layer 4 is $Ea_1$, the electron affinity of the constituent material for the light emitting layer 5 is $Ea_2$ and the electron affinity of the constituent material for the electron injecting and transporting layer 6 is $Ea_3$.

Normally, in such an organic EL element, the relations of $Ip_2 \geq Ip_3$ and $Ea_1 \geq Ea_2$ are established, it is difficult to efficiently recombine charges in the light emitting layer to generate excitation condition and to radiative deactivation. Thus, it is assumed that the luminous efficiency may lower or the lifetime properties worsen because holes and electrons penetrate to the counter electrode so that electrons are injected to the hole injecting and transporting layer or holes are injected to the electron injecting and transporting layer. However, in the present invention, the relation of the ionization potential of the constituent material for the electron injecting and transporting layer and the ionization potential of the constituent material for the light emitting layer is $Ip_2 \geq Ip_3$, and the relation of the electron affinity of the constituent material for the hole injecting and transporting layer and the electron affinity of the constituent material for the light emitting layer is $Ea_1 \geq Ea_2$. Accordingly, although holes and electrons penetrate to the counter electrode, holes and electrons are smoothly transported between the anode and the cathode so that deterioration at interfaces of the hole injecting and transporting layer, the light emitting layer, and the electron injecting and transporting layer caused during the driving can be restrained. Further, since the holes and electrons are smoothly transported, the holes and electrons rebound in the whole light emitting layer, there is no significant lowering in the rebinding rate of the holes and electrons. Thereby, by appropriately selecting materials used for each of the hole injecting and transporting layer, electron injecting and transporting layer, and light emitting layer so as the relation of the ionization potential of the constituent material for the electron injecting and transporting layer and the ionization potential of the constituent material for the light emitting layer becomes $Ip_2 \geq Ip_3$, and the relation of the electron affinity of the constituent material for the hole injecting and transporting layer and the electron affinity of the constituent material for the light emitting layer becomes $Ea_1 \geq Ea_2$, it is possible to advance the high-efficiency and to obtain significantly stable lifetime properties.

Figure 5:
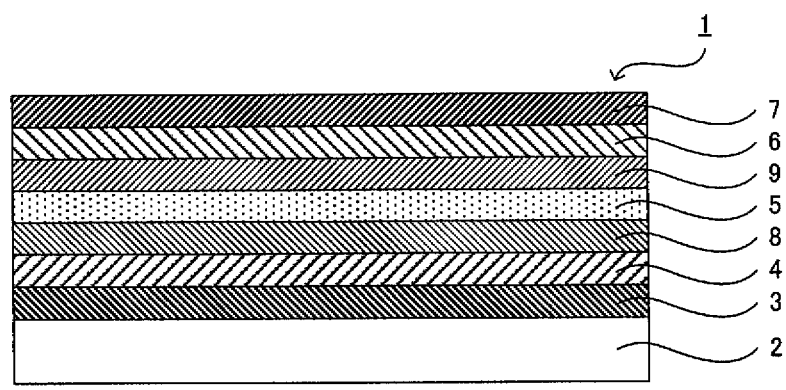
FIG. 5 is a schematic cross-sectional view illustrating another embodiment of the organic EL element of the present invention.
Figure 6:
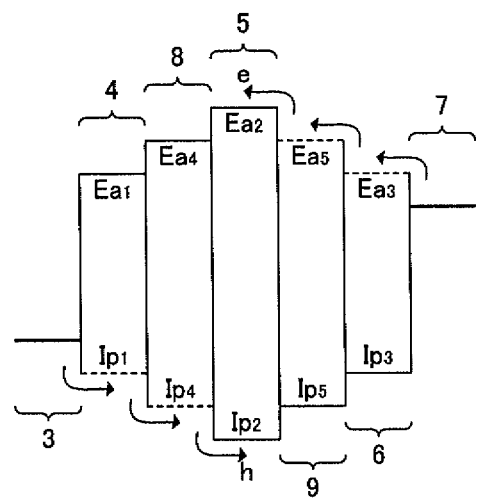
FIG. 6 is a pattern diagram showing one embodiment of the band diagram of the organic EL element of the present invention.
Figure 7:
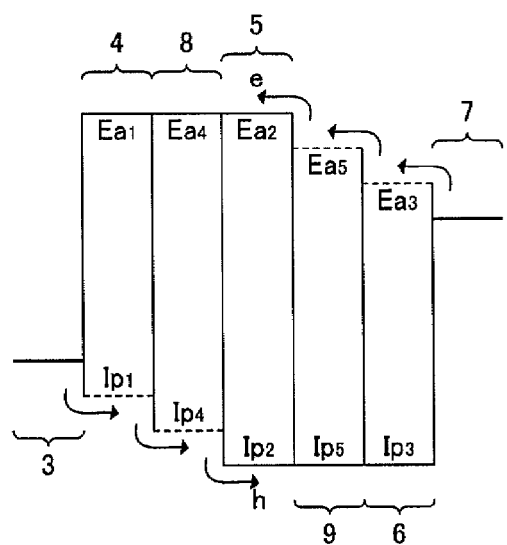
FIG. 7 is a pattern diagram showing another embodiment of the band diagram of the organic EL element of the present invention.

FIG. 5 is a schematic cross-sectional view illustrating one embodiment of the organic EL element of the present invention. FIGS. 6 and 7 are each a pattern diagram showing one example of the band diagram of the organic EL element shown in FIG. 5.

In the present invention, as shown in FIG. 5, a second hole injecting and transporting layer 8 may be formed between a hole injecting and transporting layer 4 and a light emitting layer 5, or alternatively a second electron injecting and transporting layer 9 may be formed between an electron injecting and transporting layer 6 and a light emitting layer 5.

In this organic EL element, the relation may be $Ip_2>Ip_4>Ip_1$ and $Ip_2>Ip_5>Ip_3$ as shown in FIG. 6, or may be $Ip_2>Ip_4>Ip_1$ and $Ip_2=Ip_5=Ip_3$ as shown in FIG. 7, when the ionization potential of the constituent material for the hole injecting and transporting layer 4 is $Ip_1$, the ionization potential of the constituent material for the second hole injecting and transporting layer 8 is $Ip_4$, the ionization potential of the constituent material for the light emitting layer 5 is $Ip_2$, the ionization potential of the constituent material for the electron injecting and transporting layer 6 is $Ip_3$, and the ionization potential of the constituent material for the second electron injecting and transporting layer 9 is $Ip_5$. Further, the relation may be $Ea_1>Ea_4>Ea_2$ and $Ea_3>Ea_5>Ea_2$ as shown in FIG. 6, or may be $Ea_1=Ea_4=Ea_2$ and $Ea_3>Ea_5>Ea_2$ as shown in FIG. 7, when the electron affinity of the constituent material for the hole injecting and transporting layer 4 is $Ea_1$, the electron affinity of the constituent material for the second hole injecting and transporting layer 8 is $Ea_4$, the electron affinity of the constituent material for the light emitting layer 5 is $Ea_2$, the electron affinity of the constituent material for the electron injecting and transporting layer 6 is $Ea_3$, and the electron affinity of the constituent material for the second electron injecting and transporting layer 9 is $Ea_5$.

In such organic EL element, since the relation of the ionization potentials of the respective constituent material for the electron injecting and transporting layer, second electron injecting and transporting layer, and light emitting layer is $Ip_2 \geq Ip_5 \geq Ip_3$, and the relation of electron affinities of the respective constituent materials for the hole injecting and transporting layer, second hole injecting and transporting layer, and light emitting layer is $Ea_1 \geq Ea_4 \geq Ea_2$, similar to the above-mentioned case, deterioration at interfaces of the hole injecting and transporting layer, the second hole injecting and transporting layer, the light emitting layer, the second electron injecting and transporting layer, and the electron injecting and transporting layer caused during the driving can be restrained. Therefore, a highly efficient and long-lasting organic EL element can be obtained.

Further, when the bandgap energy of the constituent material for the light emitting layer is relatively big and the difference between the ionization potential of the constituent material for the hole injecting and transporting layer $Ip_1$ and the ionization potential of the constituent material for the light emitting layer $Ip_2$ is relatively big, by forming the second hole injecting and transporting layer between the hole injecting and transporting layer and the light emitting layer in such a manner so as the relation becomes $Ip_1<Ip_4<Ip_2$, holes can be smoothly transported from the hole injecting and transporting layer to the second hole injecting and transporting layer via the light emitting layer.

On the other hand, when the bandgap energy of the constituent material for the light emitting layer is relatively big and the difference between the electron affinity of the constituent material for the electron injecting and transporting layer $Ea_3$ and the electron affinity of the constituent material for the light emitting layer $Ea_2$ is relatively big, by forming the second electron injecting and transporting layer between the electron injecting and transporting layer and the light emitting layer in such a manner so as the relation becomes $Ea_2<Ea_5<Ea_3$, electrons can be smoothly transported from the electron injecting and transporting layer to the light emitting layer via the second electron injecting and transporting layer.

In the present invention, as no conventional blocking layer is provided in the element, it may be difficult to efficiently rebind the holes and electrons in the light emitting layer as mentioned above. Therefore, it is efficient to optimize the element structure in order to improve the luminous efficiency. For example, the luminous efficiency can be improved by: (1) thickening relatively the film thickness of the light emitting layer; (2) making the relation of $Ip_1<Ip_2$; (3) making the relation of $Ea_2<Ea_3$; (4) making the bandgap of the light emitting dopant included in the bandgap of the host material when the light emitting layer comprises the host material and the light emitting dopant; (5) having distribution in the concentration of the light emitting dopant contained in the light emitting layer when the light emitting layer comprises the host material and the light emitting dopant; (6) forming the second hole injecting and transporting layer; and (7) forming the second electron injecting and transporting layer.

Hereinafter, each structural member of the organic EL element of the present embodiment will be explained.

1. Ionization Potential and Electron Affinity

In the present invention, a relation of $Ip_2 \geq Ip_3$ is established when an ionization potential of a constituent material for the light emitting layer is $Ip_2$ and an ionization potential of a constituent material for the electron injecting and transporting layer is $Ip_3$, and a relation of $Ea_1 \geq Ea_2$ is established when an electron affinity of a constituent material for the hole injecting and transporting layer is $Ea_1$ and an electron affinity of the constituent material for the light emitting layer is $Ea_2$.

The "ionization potential of the constituent material" for the respective layers denotes the ionization potential of the material constituting each layer when the respective layer is formed by a single material, and denotes the ionization potential of the host material when the respective layer is formed by a host material and a dopant. Likewise, the "electron affinity of the constituent material" for the respective layers denotes the electron affinity of the material constituting each layer when the respective layer is formed by a single material, and denotes the electron affinity of the host material when the respective layer is formed by a host material and a dopant.

As the relation between the ionization potential of the constituent material for the light emitting layer and the ionization potential of the constituent material for the electron injecting and transporting layer, it is suffice if a relation of $Ip_2 \geq Ip_3$ is established when an ionization potential of a constituent material for the light emitting layer is $Ip_2$ and an ionization potential of a constituent material for the electron injecting and transporting layer is $Ip_3$. Further, it is preferable if the relation is $Ip_2>Ip_3$. This is because, if the relations are $Ip_2>Ip_3$ and $Ea_2<Ea_3$, it is possible to relatively enlarge the bandgap energy of the constituent material for the light emitting layer, so that for example, selecting the host material and light emitting dopant becomes easy, so as to allow the ionization potentials and the electron affinities of the host material and the light emitting dopant to fulfill the predetermined relations to improve the luminous efficiency when the light emitting layer contains a host material and a light emitting dopant.

When the relation is $Ip_2>Ip_3$, the difference between $Ip_2$ and $Ip_3$ varies depending on the respective constituent materials of the light emitting layer and the electron injecting and transporting layer. Specifically, it is preferable to be 0.2 eV or more.

Further, as the relation between the ionization potential of the constituent material for the hole injecting and transporting layer and the ionization potential of the constituent material for the light emitting layer, the relation is normally $Ip_1 \geq Ip_2$ when an ionization potential of a constituent material for the hole injecting and transporting layer is $Ip_1$ and an ionization potential of a constituent material for the light emitting layer is $Ip_2$. In particular, it is preferable if the relation is $Ip_1>Ip_2$. This is because by having some energy barrier, hole injection during the hole transportation from the hole injecting and transporting layer to the light emitting layer can be controlled and thereby, luminous efficiency can be improved.

When the relation is $Ip_1<Ip_2$, the difference between the $Ip_1$ and $Ip_2$ varies depending on the respective constituent materials of the hole injecting and transporting layer and the light emitting layer. Specifically, it is preferable to be 0.2 eV or more.

Even when the difference between the $Ip_1$ and $Ip_2$ is relatively big, holes can be transported from the hole injecting and transporting layer to the light emitting layer by relatively raising a driving voltage.

As the relation between the electron affinity of a constituent material for the hole injecting and transporting layer and the electron affinity of a constituent material for the light emitting layer, it is suffice if a relation of $Ea_1 \geq Ea_2$ is established when an electron affinity of a constituent material for the hole injecting and transporting layer is $Ea_1$ and an electron affinity of a constituent material for the light emitting layer is $Ea_2$. In particular, it is preferable if the relation is $Ea_1>Ea_2$. This is because, if the relations are $Ea_1>Ea_2$ and $Ip_1<Ip_2$, it is possible to relatively enlarge the bandgap energy of the constituent material for the light emitting layer, so that for example, selecting the host material and light emitting dopant becomes easy, so as to allow the ionization potentials and the electron affinities of the host material and the light emitting dopant to fulfill the predetermined relations to improve the luminous efficiency when the light emitting layer contains a host material and a light emitting dopant.

When the relation is $Ea_1>Ea_2$, the difference between $Ea_1$ and $Ea_2$ varies depending on the respective constituent materials of the hole injecting and light emitting layer. Specifically, it is preferable to be 0.2 eV or more.

Further, as the relation between the electron affinity of a constituent material for the light emitting layer and the electron affinity of a constituent material for the electron injecting and transporting layer, the relation is normally $Ea_2 \geq Ea_3$ when an electron affinity of a constituent material for the light emitting layer is $Ea_2$ and an electron affinity of a constituent material for the electron injecting and transporting layer is $Ea_3$. In particular, it is preferable if the relation is $Ea_2>Ea_3$. This is because by having some energy barrier, electron injection during the electron transportation from the electron injecting and transporting layer to the light emitting layer can be controlled and thereby, luminous efficiency can be improved.

When the relation is $Ea_2<Ea_3$, the difference between $Ea_2$ and $Ea_3$ varies depending on the respective constituent materials of the light emitting layer and the electron injecting and transporting layer. Specifically, it is preferable to be 0.2 eV or more.

Even when the difference between $Ea_2$ and $Ea_3$ is relatively big, electrons can be transported from the electron injecting and transporting layer to the light emitting layer by relatively raising a driving voltage.

When the second hole injecting and transporting layer is formed between the hole injecting and transporting layer and the light emitting layer, the relation of the electron affinity of the hole injecting and transporting layer, the second hole injecting and transporting layer, and the light emitting layer is preferably $Ea_1 \geq Ea_4 \geq Ea_2$, when the electron affinity of the constituent material for the hole injecting and transporting layer is $Ea_1$, the electron affinity of the constituent material for the second hole injecting and transporting layer is $Ea_4$, and the electron affinity of the constituent material for the light emitting layer is $Ea_2$. Thereby, deterioration at interfaces of the hole injecting and transporting layer, the second hole injecting and transporting layer, and the light emitting layer caused during the driving can be restrained.

Further, when the second hole injecting and transporting layer is formed between the hole injecting and transporting layer and the light emitting layer, the relation of the ionization potentials of the hole injecting and transporting layer, the second hole injecting and transporting layer, and the light emitting layer is normally $Ip_1 \leq Ip_4 \leq Ip_2$, when the ionization potential of the constituent material for the hole injecting and transporting layer is $Ip_1$, the ionization potential of the constituent material for the second hole injecting and transporting layer is $Ip_4$, and the ionization potential of the constituent material for the light emitting layer is $Ip_2$. In particular, the relation is preferably $Ip_1 < Ip_4 < Ip_2$. When the difference between the $Ip_1$ and $Ip_2$ is relatively big, although holes are less likely to be transported from the hole injecting and transporting layer to the light emitting layer, by forming the second hole injecting and transporting layer between the hole injecting and transporting layer and the light emitting layer in such a manner so as the relation becomes $Ip_1 < Ip_4 < Ip_2$, holes can be smoothly transported from the hole injecting and transporting layer to the light emitting layer via the second hole injecting and transporting layer. Further, by having some energy barrier during the hole transportation from the hole injecting and transporting layer to the second hole injecting and transporting layer, and from the second hole injecting and transporting layer to the light emitting layer, hole injection can be controlled and luminous efficiency can be improved.

When the relation is $Ip_1 < Ip_4 < Ip_2$, the difference between $Ip_1$ and $Ip_4$, and between $Ip_4$ and $Ip_2$ varies depending on the respective constituent materials of the hole injecting and transporting layer, the second hole injecting and transporting layer, and the light emitting layer. Specifically, it is preferable to be 0.2 eV or more, and even more preferably to be within the range of 0.2 eV to 0.5 eV, respectively.

When the second electron injecting and transporting layer is formed between the electron injecting and transporting layer and the light emitting layer, the relation of the ionization potentials of the electron injecting and transporting layer, the second electron injecting and transporting layer, and the light emitting layer is preferably $Ip_2 \leq Ip_5 \leq Ip_3$, when the ionization potential of the constituent material for the light emitting layer is $Ip_2$, the ionization potential of the constituent material for the second electron injecting and transporting layer is $Ip_5$, and the ionization potential of the constituent material for the electron injecting and transporting layer is $Ip_3$. Thereby, deterioration at interfaces of the electron injecting and transporting layer, the second electron injecting and transporting layer and the light emitting layer during the driving can be restrained.

Further, when the second electron injecting and transporting layer is formed between the electron injecting and transporting layer and the light emitting layer, the relation of the electron affinities of the electron injecting and transporting layer, the second electron injecting and transporting layer, and the light emitting layer is normally $Ea_2 \leq Ea_5 \leq Ea_3$, when the electron affinity of the constituent material for the light emitting layer is $Ea_2$, the electron affinity of the constituent material for the second electron injecting and transporting layer is $Ea_5$, and the electron affinity of the constituent material for the electron injecting and transporting layer is $Ea_3$. In particular, the relation is preferably $Ea_2 < Ea_5 < Ea_3$. When the difference between the $Ea_2$ and $Ea_3$ is relatively big, although electrons are less likely to be transported from the electron injecting and transporting layer to the light emitting layer, by forming the second electron injecting and transporting layer between the electron injecting and transporting layer and the light emitting layer in such a manner so as the relation becomes $Ea_2 < Ea_5 < Ea_3$, electrons can be smoothly transported from the electron injecting and transporting layer to the light emitting layer via the second electron injecting and transporting layer. Further, by having some energy barrier during the electron transportation from the electron injecting and transporting layer to the second electron injecting and transporting layer, and from the second electron injecting and transporting layer to the light emitting layer, electron injection can be controlled and luminous efficiency can be improved.

When the relation is $Ea_2 < Ea_5 < Ea_3$, the difference between $Ea_2$ and $Ea_5$, and between $Ea_5$ and $Ea_3$ vary depending on the respective constituent materials of the electron injecting and transporting layer, the second electron injecting and transporting layer and the light emitting layer. Specifically, it is preferable to be 0.2 eV or more, and even more preferably to be within the range of 0.2 eV to 0.5 eV, respectively.

The ionization potentials and the electron affinities of the respective layers are obtained as follows.

First, an ionization potential and an electron affinity of a single molecule are calculated regarding the above-mentioned constituent materials using the molecular orbital calculation software Gaussian 03™. Specifically, a neutral molecular structure is optimized by B3LYP/6-31g(d) using the molecular orbital calculation software Gaussian 03™, three sets of energy calculations of positive, negative and neutral charges are conducted by B3LYP/6-311g++(d,p), and thereby the respective ionization potentials and electron affinities of the single molecule are obtained by taking the differences thereof.

Next, forming the above-mentioned constituent materials by a vacuum deposition method, the ionization potentials of the respective deposited films are obtained by UPS (UV photoelectron) or the UV photoelectron device AC-2™ or AC-3™ manufactured by RIKEN KEIKI CO., LTD. Then, the difference between the ionization potentials of the respective single molecules and the ionization potentials of the respective deposited films are deducted from the respective electron affinities of each single molecule, the electron affinity of the respective deposited film are calculated. In general, the ionization potentials and the electron affinities show different values between the single molecules and the solid state, which is caused by the difference in the polarization energy of the solid state. The polarization energy of a solid takes the same value as the first-order approximation to the holes and to the electrons. Thus, it is possible to assume an electron affinity of a solid by obtaining a polarization energy to a hole by taking a difference between an ionization potential of a single molecule and an ionization potential of a solid, and by deducting the polarization energy value to the hole from the electron affinity of the single molecule.

The measurement error in the ionization potentials and the electron affinities of the deposited films is about ±0.1 eV.

The respective ionization potentials and the electron affinities of the deposited films thereby obtained are the ionization potentials and the electron affinities of the respective constituent materials for each layer.

2. Hole Injecting and Transporting Layer

The hole injecting and transporting layer used in the present invention is formed between the anode and the light emitting layer and has a function to stably inject or transport holes from the anode to the light emitting layer.

As the hole injecting and transporting layer, the layer may be either of a hole injecting layer having a hole injecting function or a hole transporting layer having a hole transporting function, or alternatively, a single layer having both functions of the hole injecting function and the hole transporting function.

A constituent material of the hole injecting and transporting layer is not particularly limited as long as it is a material which can stably transport the holes injected from the anode into the light emitting layer. Apart from the above-mentioned compounds listed as the light emitting material for the light emitting layer, arylamines, starburst type amines, phthalocyanins, oxides such as vanadium oxide, molybdenum oxide, ruthenium oxide, and aluminum oxide, a conductive polymer such as amorphous carbon, polyaniline, polythiophene, polyphenylenevinylene, and derivatives thereof can be used. The conductive polymers such as polyaniline, polythiophene and polyphenylenevinylene and derivatives thereof may have an acid doped. More specifically, substances such as N,N'-bis (naphthalene-1-yl)-N,N'-bis(phenyl)-benzidine (α-NPD), 4,4,4-tris(3-methylphenylphenylamino)triphenylamine (MTDATA), poly(3,4-ethylenedioxithiophene)/polystyrene sulfonate (PEDOT/PSS) and polyvinyl carbazole (PVCz) can be cited.

In particular, the constituent material for the hole injecting and transporting layer is preferably a bipolar material which can transport a hole and an electron.

The "bipolar material" denotes to a material which can stably transport both of holes and electrons, is a material which can stably transport electrons when a unipolar device for electrons is manufactured by using a material doped with the reducing dopant, and is a material which can stably transport holes when a unipolar device for holes is manufactured by using a material doped with an oxidizing dopant. In manufacturing unipolar devices, a unipolar device for electrons are manufactured by doping Cs or 8-hydroxyquinolinolatolithium (Liq) as a reducing dopant doped in the material, and a unipolar device for holes are manufactured by doping $V_2O_5$ or $MoO_3$ as an oxidizing dopant doped in the material.

By using such bipolar materials for the hole injecting and transporting layer, deterioration at interfaces of the light emitting layer and the hole injecting and transporting layer during driving can be efficiently restrained.

As examples of the bipolar material, a distyrylarene derivative, a polyaromatic compound, condensed ring aromatic compounds, a carbazole derivative, and a heterocyclic compound can be cited. More specifically, 4,4'-bis(2,2-diphenyl-ethen-1-yl)diphenyl(DPVBi), spiro-4,4'-bis(2,2-diphenyl-ethen-1-yl)diphenyl(spiro-DPVBi), spiro-6P, 4,4'-bis (carbazol-9-yl)biphenyl(CBP), 2,2',7,7'-tetrakis(carbazol-9-yl)-9,9'-spiro-bifluorene (spiro-CBP), 4,4''-di(N-carbazolyl)-2',3',5',6'-tetraphenyl-p-terphenyl (CzTT), 1,3-bis(carbazole-9-yl)-benzene (m-CP), 3-tert-butyl-9,10-di (naphtha-2-yl)anthracene (TBADN) represented by the below formula and derivatives thereof can be cited as examples.

[Chemical Formula 2]

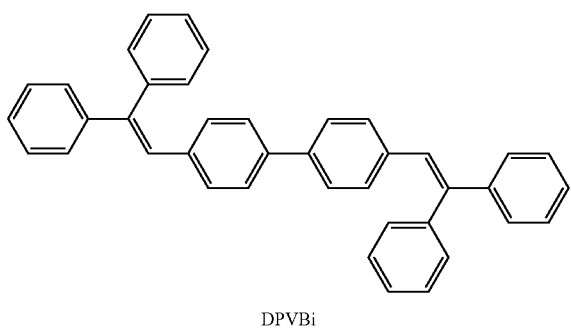

DPVBi

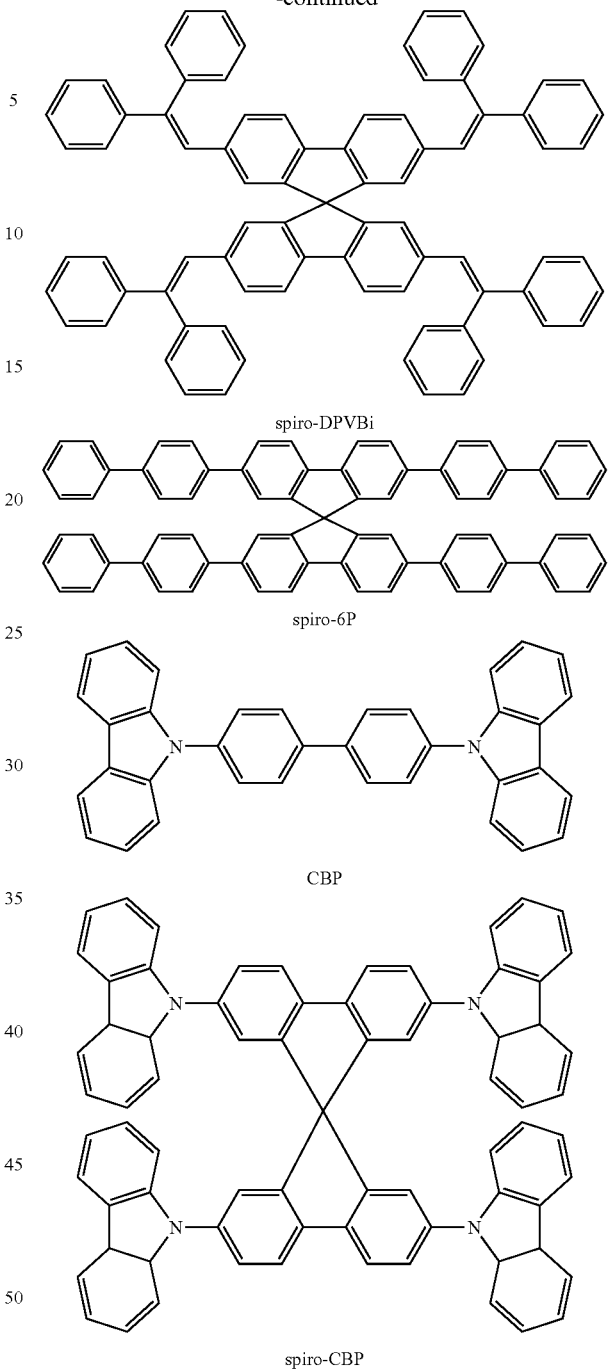

spiro-DPVBi spiro-6P

CBP spiro-CBP

[Chemical Formula 3]

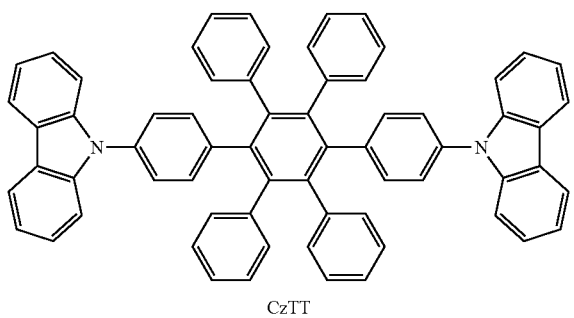

CzTT

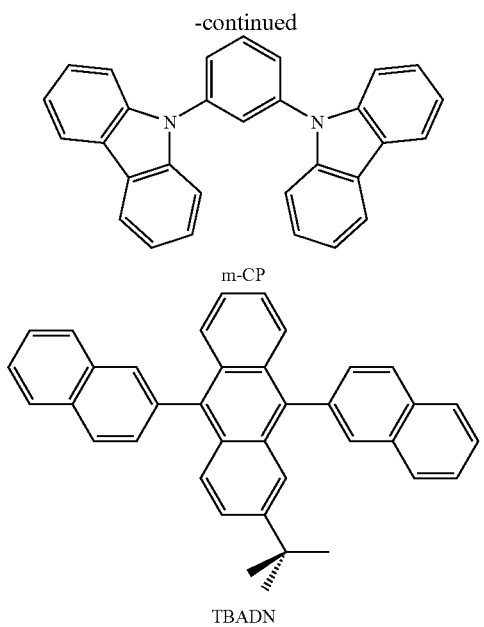

m-CP

TBADN

All materials which are confirmed that they can transport both of carries of holes and electrons by the above-mentioned method can be used as the bipolar material for the present invention.

Further, when both of the hole injecting and transporting layer and the electron injecting and transporting layer (to be explained later) contain the bipolar material, the bipolar material contained in the hole injecting and transporting layer and the bipolar material contained in the electron injecting and transporting layer may be identical or different. In particular, the bipolar material contained in the hole injecting and transporting layer and the bipolar material contained in the electron injecting and transporting layer is preferably identical. This is because, by these bipolar materials being identical, these layers are less likely to be deteriorated even if holes penetrate the electron injecting and transporting layer and electrons penetrate the hole injecting and transporting layer. Moreover, it is advantageous in the producing process when forming these layers by a method such as the vacuum deposition method because they can share a common deposition source.

Still further, when all of the hole injecting and transporting layer, electron injecting and transporting layer, and light emitting layer contain the bipolar material, the respective bipolar material contained in each of the hole injecting and transporting layer, electron injecting and transporting layer, and light emitting layer may be identical or different. In particular, the bipolar materials contained in the respective hole injecting and transporting layer, electron injecting and transporting layer, and light emitting layer are preferably identical. This is because, as explained above, by these bipolar materials being identical, these layers are less likely to be deteriorated even if holes penetrate the electron injecting and transporting layer and electrons penetrate the hole injecting and transporting layer. Moreover, it is advantageous in the producing process when forming these layers by a method such as the vacuum deposition method because they can share a common deposition source.

When the constituent material for the hole injecting and transporting layer is an organic material (organic compound for the hole injecting and transporting layer), it is preferable that the hole injecting and transporting layer has a region where an oxidizing dopant is mixed into the organic compound for the hole injecting and transporting layer at an interface to at least the anode. By the hole injecting and transporting layer having a region where an oxidizing dopant is mixed into the organic compound for the hole injecting and transporting layer at an interface to at least the anode, the hole injecting barrier caused when injecting holes from the anode to the hole injecting and transporting layer becomes small and thereby, lower the driving voltage.

In the organic EL element, a process of injecting holes from an anode to an organic layer, which is basically an insulating material, is a process of oxidizing the organic compound at the anode surface, i.e., a process of forming a radical cationic state (Phys. Rev. Lett., 14, 229 (1965)). By preliminary doping an oxidizing dopant which oxidizes the organic compound into the hole injecting and transporting layer which contacts to the anode, it is possible to lower the energy barrier caused in injecting holes from the anode. As the organic compound oxidized by the oxidizing dopant and in an oxidized state (that is the electron-donating state) is presented in the hole injecting and transporting layer doped with the oxidizing dopant, hole injecting energy barrier is small and the driving voltage can be lowered compare to the case of a conventional organic EL element.

Oxidizing dopant is not limited as long it has properties to oxidize an organic compound for the hole injecting and transporting layer, and an electron-accepting compound is normally used.

As an electron-accepting compound, both of an inorganic kind and an organic kind can be used. When the electron-accepting compound is an inorganic kind, ferric chloride, aluminum chloride, gallium chloride, indium chloride, antimony pentachloride, and a Lewis acid such as molybdic anhydride ($MoO_3$) and vanadium pentoxide ($V_2O_5$) can be cited as examples. When the electron-accepting compound is an organic kind, a substance such as trinitrofluorenone can be cited.

Among the above, a metal oxide is preferable as an electron-accepting compound, and $MoO_3$ and $V_2O_5$ are suitably used.

When the hole injecting and transporting layer has a region where an oxidizing dopant is mixed into an organic compound for the hole injecting and transporting layer, it is sufficient if the hole injecting and transporting layer has such region at an interface to at least the anode. For example, the oxidizing dopant may be universally doped in the hole injecting and transporting layer, the oxidizing dopant may be doped in such a manner that the amount thereof continuously increases from the light emitting layer side to the anode side, or the oxidizing dopant may be doped locally only at the interface to the anode of the hole injecting and transporting layer.

The oxidizing dopant concentration in the hole injecting and transporting layer is not particularly limited, but it is preferable that the mole ratio of the organic compound for the hole injecting and transporting layer and the oxidizing dopant is within the following range; organic compound for the hole injecting and transporting layer:oxidizing dopant=1:0.1 to 1:10. If the ratio of the oxidizing dopant is less than the above-mentioned range, sufficient doping effect may not be obtained because the concentration of the organic compound for the hole injecting and transporting layer oxidized by the oxidizing dopant is too low. If the ratio of the oxidizing dopant is more than above-mentioned range, similar to the above case, sufficient doping effect may not be obtained because the concentration of the oxidizing dopant in the hole injecting and transporting layer becomes far stronger than the concentration of the organic compound for the hole injecting and transporting layer so that the concentration of the organic compound for the hole injecting and transporting layer oxidized by the oxidizing dopant extremely lowers.

As examples of a film forming method of the hole injecting and transporting layer, a dry method such as such as vacuum deposition method, or a sputtering, and a wet method such as printing method, ink-jet method, spin coating method, casting method, dipping method, bar coating method, blade coating method, roll coating method, gravure coating method, flexo printing method, and spray coating can be cited.

In particular, as a film forming method of the hole injecting and transporting layer doped with the oxidizing dopant, a method of codepositing the organic compound for the hole injecting and transporting layer and the oxidizing dopant is preferably used. In this codepositing method, the oxidizing dopant having relatively low saturated vapor pressure, such as ferric chloride and indium chloride, is deposited in a crucible and can be deposited by a general resistive heating method. On the other hand, if it is difficult to keep the atmospheric pressure in the vacuum device to the predetermined pressure or lower because the subject has a high vapor pressure at room temperature, the vapor pressure may be adjusted by controlling an orifice (opening part) such as a needle valve or a mass flow controller, or the vapor pressure may be controlled through cooling by independently making the sample holder to a structure which allows the temperature control.

Further, as a method of mixing the oxidizing dopant to the organic compound for the hole injecting and transporting layer in such a manner that the amount thereof continuously increases from the light emitting layer side to the anode side, for example, a method of continuously changing the deposition speed of the organic compound for the hole injecting and transporting layer and the oxidizing dopant may be used.

A thickness of the hole injecting and transporting layer is not particularly limited as long as it allows the function of injecting holes from the anode and of transporting the holes to the light emitting layer to exhibit fully. Specifically, the thickness can be set about 0.5 nm to 1000 nm, and is preferably within the range of 5 nm to 500 nm.

Further, a thickness of the hole injecting and transporting layer doped with the oxidizing dopant is not particularly limited, and preferably be 0.5 nm or more. As the hole injecting and transporting layer doped with the oxidizing dopant has the organic compound for the hole injecting and transporting layer in radical cationic state even in the non-electric field state and can behave as internal charges, the thickness is not particularly limited. Moreover, even if the thickness of the hole injecting and transporting layer doped with the oxidizing dopant is made thick, there is no voltage raise in the element so that a risk of causing a short circuit can be significantly reduced by setting the distance between the anode and the cathode longer than that of a normal organic EL element.

3. Electron Injecting and Transporting Layer

An electron injecting and transporting layer used in the present invention is formed between the cathode and the light emitting layer, and has a function to stably inject or transport electrons from the cathode to the light emitting layer.

The electron injecting and transporting layer may be either of an electron injecting layer having an electron injecting function and an electron transporting layer having an electron transporting function, or alternatively, may be a single layer having both functions of the electron injecting function and the electron transporting function.

A constituent material for the electron injecting layer is not particularly limited as long as it can stabilize the injection of electrons into the light emitting layer. Apart from the light emitting materials listed for the light emitting layer, an alkali metal such as Ba, Ca, Li, Cs, Mg, and Sr or an single alkali earth metal; an alkali metal such as magnesium fluoride, calcium fluoride, strontium fluoride, barium fluoride, lithium fluoride, and cesium fluoride, or a fluoride of an alkali earth metal; an alloy of an alkali metal such as aluminum-lithium metal; a metal oxide such as magnesia oxide, strontium oxide, and aluminum oxide; and an organic complex of an alkali metal such as polymethylmethacrylate sodium polystyrene sulfonate can be cited.

Further, a constituent material for the electron transporting layer is not particularly limited as long as the material can transport the electrons injected from the cathode to the light emitting layer. For example, phenanthroline derivatives such as bathocuproin (BCP), bathophenanthroline (Bpehn), triazole derivatives, oxadiazole derivatives and aluminum quinolinol complexes such as tris(8-hydroxyquinolinolato)aluminum (Alq3) can be cited.

In particular, the constituent material for the electron injecting and transporting layer is preferably a bipolar material which can transport holes and electrons. By using the bipolar material for the electron injecting and transporting layer, deterioration at the interfaces of the light emitting layer and the electron injecting and transporting layer during driving can be effectively restrained.

As the bipolar materials are explained in the above-mentioned section of the hole injecting and transporting layer, explanation here is omitted.

When the constituent material for the electron injecting and transporting layer is an organic material (organic compound for the electron injecting and transporting layer), it is preferable that the electron injecting and transporting layer has a region where a reducing dopant is mixed into the organic compound for the electron injecting and transporting layer at an interface to at least the cathode. By the electron injecting and transporting layer having a region where a reducing dopant is mixed into the organic compound for the electron injecting and transporting layer at an interface to at least the cathode, the electron injecting barrier caused when injecting electrons from the cathode to the electron injecting and transporting layer becomes small and thereby, lower the driving voltage.

In the organic EL element, a process of injecting electrons from a cathode to an organic layer, which is basically an insulating material, is a process of reducing the organic compound at the cathode surface, i.e., a process of forming a radical anionic state (Phys. Rev. Lett., 14, 229 (1965)). By preliminary doping a reducing dopant which reduces the organic compound into the electron injecting and transporting layer which contacts to the cathode, it is possible to lower the energy barrier caused in injecting electrons from the cathode. As the organic compound reduced by the reducing agent and in a reduced state (that is the sate receiving electrons and injected with electrons) is presented in the electron injecting and transporting layer, electron injecting energy barrier is small and the driving voltage can be lowered compare to the case of a conventional organic EL element. Further, a metal such as a stable Al which is generally used as a wiring material may be used for the cathode.

Reducing dopant is not limited as long as it has properties to reduce an organic compound for the electron injecting and transporting layer, and an electron-accepting compound is normally used.

As an electron donating compound, a metal (metal alone), a metal compound, or an organometallic complex is preferably used. As a metal (metal alone), metal compound, or an organometallic complex, a substance comprising at least one metal selected from the group consisting of a alkali metal, an alkali earth metal and a transition metal comprising a rare-earth metal can be cited. In particular, it is preferable to contain at least a metal selected from the group consisting of an alkali metal, an alkali earth metal and a transition metal comprising a rare-earth metal having a work function of 4.2 eV or less. As such a metal (metal alone), Li, Na, K, Cs, Be, Mg, Ca, Sr, Ba, Y, La, Mg, Sm, Gd, Yb, and W can be cited as examples. As such metal compound, metal oxides such as $Li_2O$, $Na_2O$, $K_2O$, $Rb_2O$, $CS_2O$, MgO, and CaO; and metal salts such as LiF, NaF, KF, RbF, CsF, $MgF_2$, $CaF_2$, $SrF_2$, $BaF_2$, LiCl, NaCl, KCl, RbCl, CsCl, $MgCl_2$, $CaCl_2$, $SrCl_2$, and $BaCl_2$ can be cited as examples. As organometallic complexes, an organic metal compound containing W and 8-hydroxyquinolinolatolithium (Liq) can be cited as examples. Among them, Cs, Li and Liq are preferably used. This is because, by doping these into an organic compound for the electron injecting and transporting layer, excellent electron injecting properties can be obtained.

When the electron injecting and transporting layer has a region where a reducing dopant is mixed into an organic compound for the electron injecting and transporting layer, it is sufficient if the electron injecting and transporting layer has such region at an interface to at least the cathode. For example, the reducing dopant may be universally doped in the electron injecting and transporting layer, the reducing dopant may be doped in such a manner that the amount thereof continuously increases from the light emitting layer side to the cathode side, or the reducing dopant may be doped locally only at the interface to the cathode of the electron injecting and transporting layer.

The reducing dopant concentration in the electron injecting and transporting layer is not particularly limited, but it is preferably about 0.1 to 99% by weight. If the concentration of the reducing dopant is less than the above-mentioned range, sufficient doping effect may not be obtained because the concentration of the organic compound for the electron injecting and transporting layer reduced by the reducing dopant is too low. If the concentration of the reducing dopant is more than above-mentioned range, similar to the above case, sufficient doping effect may not be obtained because the concentration of the reducing dopant in the electron injecting and transporting layer becomes far stronger than the concentration of the organic compound for the electron injecting and transporting layer so that the concentration of the organic compound for the electron injecting and transporting layer reduced by the reducing dopant extremely lowers.

As a film forming method of the electron injecting and transporting layer, a dry method such as vacuum deposition method, and a sputtering, and a wet method such as printing method, ink-jet method, spin coating method, casting method, dipping method, bar coating method, blade coating method, roll coating method, gravure coating method, flexo printing method, and spray coating can be cited.

In particular, as a film forming method of the electron injecting and transporting layer doped with the reducing dopant, a method of codepositing the organic compound for the electron injecting and transporting layer and the reducing dopant is preferably used.

When a thin film can be formed by coating a solution, a method such as a spin coating or dip coating can be used as a film forming method of the electron injecting and transporting layer doped with the reducing dopant. In this case, the organic compound for the electron injecting and transporting layer and the reducing dopant may be dispersed into an inactive polymer.

Further, as a method of mixing the reducing dopant to the organic compound for the electron injecting and transporting layer in such a manner that the amount thereof continuously increases from the light emitting layer side to the cathode side, for example, a method of continuously changing the deposition speed of the organic compound for the electron injecting and transporting layer and the reducing dopant may be used.

A thickness of the electron injecting layer is not particularly limited as long as it allows the function of injecting electrons to exhibit fully. A thickness of the electron transporting layer is not particularly limited as long as it allows the function of transporting electrons to exhibit fully.

Further, a thickness of the electron injecting and transporting layer doped with the reducing dopant is not particularly limited, and preferably be within the range of 0.1 nm to 300 nm, and more preferably within the range of 0.5 nm to 200 nm. When the thickness is less than the above-mentioned range, sufficient doping effect may not be obtained because the amount of the organic compound for the electron injecting and transporting layer doped with the reducing dopant presented nearby to the cathode interface is small. When the thickness is more than the above-mentioned range, there is a risk of raising a driving voltage because the film thickness of the whole electron injecting and transporting layer is too thick.

4. Light Emitting Layer

A light emitting layer used in the present invention has a function to provide a place for electrons and holes to rebind and to emit light. As a constituent material for the light emitting layer, pigment base materials, metal complex based materials, and polymer based materials can be cited.

As the pigment based light emitting materials, for example, cyclopentadiene derivatives, tetraphenyl butadiene derivatives, triphenyl amine derivatives, oxadiazol derivatives, pyrazoloquinoline derivatives, distylyl benzene derivatives, distylyl arylene derivatives, silol derivatives, a thiophene ring compound, a pyridine ring compound, perynon derivatives, perylene derivatives, oligothiophene derivatives, triphmanyl amine derivatives, coumalin derivatives, an oxadiazol dimer, and a pyrazoline dimer, can be presented.

As the metal complex based light emitting materials, for example, metal complexes having Al, Zn, Be, or the like, or a rare earth metal such as Tb, Eu, Dy, or the like as the central metal, and oxadiazol, thiadiazol, phenyl pyridine, phenyl benzoimidazol, quinoline structure, or the like as the ligand, such as a aluminum quinolinol complex, a benzoquinolinol beryllium complex, a benzoxazol zinc complex, a benzothiazol zinc complex, an azomethyl zinc complex, a porphiline zinc complex, an europium complex, an iridium metal complex, a platinum metal complex, or the like can be presented. More specifically, tris(8-hydroxyquinolinolato)aluminum (Alq3) can be used.

As the polymer based light emitting materials, for example, polyparaphenylene vinylene derivatives, polythiophene derivatives, polyparaphenylene derivatives, polysilane derivatives, polyacetylene derivatives, polyvinyl carbazol, polyfluorenon derivatives, polyfluolene derivatives, polyquinoxaline derivatives, polydialkylfluolene derivatives, a polymer thereof, or the like can be presented. Further, those polymerizing the above-mentioned pigment base materials and the metal complex based material can also be cited.

Moreover, the constituent material for the light emitting layer may be the bipolar material. By using the bipolar material for the light emitting layer, deterioration caused during driving at interfaces of each of the hole injecting and transporting layer, light emitting layer, and electron injecting and transporting layer can be restrained effectively.

The bipolar material for the light emitting layer may be a light emitting material which itself emits fluorescence or phosphorescence, or a host material to which the light emitting dopant to be explained later is doped into.

As the bipolar materials are explained in the above-mentioned section of the hole injecting and transporting layer, explanation here is omitted.

Further, in order to improve luminous efficiency, to change the light emitting wavelength or the like, a light emitting dopant which emits fluorescence or phosphorescence may be added into the light emitting layer. In other words, the light emitting layer may contain the host material such as the above-mentioned pigment base material, metal complex based material, polymer based material, and bipolar material, and the light emitting dopant.

As the light emitting dopant, for example, perylene derivatives, coumalin derivatives, rubrene derivatives, quinacrydone derivatives, squalium derivatives, porphiline derivatives, a styryl based pigment, tetracene derivatives, pyrazoline derivatives, decacyclene, phenoxazone, quinoxaline derivatives, carbazol derivatives, and fluolene derivatives can be cited.

In the case the light emitting layer contains the host material and the light emitting dopant, a relation of $Ag_h < Ag_d$ is preferably established when an electron affinity of the host material is $Ag_h$ and an electron affinity of the light emitting dopant is $Ag_d$, while also a relation of $Ig_h > Ig_d$ is preferably established when an ionization potential of the host material is $Ig_h$ and an ionization potential of the light emitting dopant is $Ig_d$. When the respective electron affinities and the ionization potentials of the host material and the light emitting dopant fulfills the above-mentioned relations, the holes and electrons are trapped by the light emitting dopant, it is possible to improve the luminous efficiency.

Here, the ionization potentials and the electron affinities of the single molecule of the host material and the light emitting dopant constituting the light emitting layer are obtained as follows.

First, an ionization potential and an electron affinity of a single molecule are calculated regarding the above-mentioned constituent materials using the molecular orbital calculation software Gaussian 03™. Specifically, a neutral molecular structure is optimized by B3LYP/6-31g(d) using the molecular orbital calculation software Gaussian 03™, three sets of energy calculations of positive, negative and neutral charges to the structure is conducted by B3LYP/6-311g++(d,p), and thereby the respective ionization potentials and electron affinities are obtained by taking the differences thereof.

It was explained above that the ionization potential and the electron affinity of the deposited film shifts by the polarization energy in solid condition, but in case of the host material and the light emitting dopant, they both receive the identical polarization energy. That is, the energy level is held in the same layer while keeping the difference between the electron affinity "Ag" and the ionization potential "Ig" at molecule level. As such, the relation of the respective ionization potentials and the electron affinities of the host material and the light emitting dopant constituting the light emitting layer can be defined by the relation of the electron affinity "Ag" and the ionization potential "Ig" at molecule level.

Further, when the light emitting layer comprises a host material and a light emitting dopant, the light emitting layer preferably has distribution in its light emitting dopant concentration. Thereby, trapping of holes and electrons by the light emitting dopant can be controlled and it is possible to improve the luminous efficiency.

In the present invention, since no blocking layer which prevents holes and electrons injected to the light emitting layer from penetrating to the counter electrode is provided, it is difficult to balance holes and electrons injected to the light emitting layer unlike a conventional organic EL element which comprise a blocking layer.

As a result of various research conducted by the present inventors therefore, it was found out that luminous efficiency improves by providing distribution in the light emitting dopant concentration contained in the light emitting layer. For example, when the light emitting dopant transports holes easily compare to the electrons, there is a tendency of excess hole injection. By providing concentration gradient in such manner that the light emitting dopant concentration in the light emitting layer increases from the cathode side to the anode side, luminous efficiency improves. This is considered that, by raising the light emitting dopant concentration at the anode side, holes injected from the anode into the hole injecting and transporting layer and transported to the light emitting layer are trapped by the light emitting dopant more in the light emitting layer, particularly trapped even more at the anode side, so that they are prevented from being penetrated to the cathode. Further, for example, when the light emitting dopant transports electrons easily compare to the holes, there is a tendency of excess electron injection. By providing concentration gradient in such manner that the light emitting dopant concentration in the light emitting layer increases from the anode side to the cathode side, luminous efficiency improves. This is considered that, by raising the light emitting dopant concentration at the cathode side, electrons injected from the cathode into the electron injecting and transporting layer and transported to the light emitting layer are trapped by the light emitting dopant more in the light emitting layer, particularly trapped even more at the cathode side, so that they are prevented from being penetrated to the anode.

As a distribution in light emitting dopant concentration in the light emitting layer is not limited as long as there is a distribution in light emitting dopant concentration. For example, the a distribution in light emitting dopant concentration may have a concentration gradient which continuously changes to the thickness direction of the light emitting layer, or may have mixed regions of a region having relatively high light emitting dopant concentration and a region having relatively low light emitting dopant concentration.

When the a distribution in light emitting dopant concentration may have a concentration gradient which continuously change to the thickness direction of the light emitting layer, the light emitting dopant concentration may be high at the hole injecting and transporting layer side, or at the electron injecting and transporting layer side so that injections of holes and electrons are balanced out. For example, when the hole injection is excessive, the distribution in light emitting dopant concentration is preferably high at the hole injecting and transporting layer so that injected holes can be trapped at the anode side. Further for example, when the electron injection is excessive, the distribution in light emitting dopant concentration is preferably high at the electron injecting and transporting layer so that injected electrons can be trapped at the cathode side.

Further, when the light emitting dopant concentration has mixed regions of a region having relatively high light emitting dopant concentration and a region having relatively low light emitting dopant concentration, the followings are appropriately selected so that injections of holes and electrons are balanced out, for example: a region having relatively high light emitting dopant concentration may be provided to the hole injecting and transporting layer side and a region having relatively low light emitting dopant concentration may be provided to the electron injecting and transporting layer side; a region having relatively low light emitting dopant concentration may be provided to the hole injecting and transporting layer side, and a region having relatively high light emitting dopant concentration may be provided to the electron injecting and transporting layer side; or the light emitting dopant concentration may periodically change to the thickness direction of the light emitting layer. For instance, when hole injection is excessive, it is preferable that a region having relatively high light emitting dopant concentration is provided to the hole injecting and transporting layer side and a region having relatively low light emitting dopant concentration is provided to the electron injecting and transporting layer side so that injected holes can be trapped at the anode side. Further for instance, when electron injection is excessive, it is preferable that a region having relatively low light emitting dopant concentration is provided to the hole injecting and transporting layer side and a region having relatively high light emitting dopant concentration is provided to the electron injecting and transporting layer side so that injected electrons can be trapped at the cathode side.

Moreover, the light emitting layer may contain the host material and at least two light emitting dopants. For example, when the difference in the excitation energies of the host material and the light emitting dopant is relatively big, by further containing a light emitting dopant having excitation energy between the excitation energies of the host material and the light emitting dopant, energy is smoothly moved so that it can improve luminous efficiency. Further for example, by containing a light emitting dopant which transports more easily holes compare to electrons, and a light emitting dopant which transports more easily electrons than holes, holes and electrons injected to the light emitting layer can be balanced out so that luminous efficiency is improved.

When the light emitting layer contains at least two light emitting dopants, each light emitting dopant may emit light or only one may emit light. For example, in either of the following cases, light emission of one light emitting dopant or each of the light emitting dopants can be obtained depending on the size (big or small), distribution condition(s), concentration(s) of the excitation energy of the light emitting dopant(s): a case where the light emitting layer contains the first light emitting dopant and the second light emitting dopant which has smaller excitation energy than that of the host material and has larger excitation energy than that of the first light emitting dopant; a case where the light emitting layer contains the third light emitting dopant which transports holes more easily than electrons and the fourth light emitting dopant which transports electrons more easily than holes.

When the light emitting layer has at least two light emitting dopants, from the point of view of improving the luminous efficiency, it is possible to have the light emitting layer contain: the first light emitting dopant and the second light emitting dopant which has smaller excitation energy than that of the host material and has larger excitation energy than that of the first light emitting dopant; or alternatively, the third light emitting dopant which transports holes more easily than electrons and the fourth light emitting dopant which transports electrons more easily than holes.

When the light emitting layer contains the first light emitting dopant and the second light emitting dopant which has smaller excitation energy than that of the host material and has larger excitation energy than that of the first light emitting dopant, the first light emitting dopant and the second light emitting dopant can be appropriately selected from the above-mentioned light emitting dopants. For example, when Alq3, which emits green, is used as the host material and DCM, which emits red, is used as the first light emitting dopant, by using rubrene, which emits yellow, as the second light emitting dopant, energy can be smoothly moved in order of Alq3 (host material)→rubrene (second light emitting dopant)→DCM (first light emitting dopant).

Further, when the light emitting layer contains the third light emitting dopant which transports holes more easily than electrons and the fourth light emitting dopant which transports electrons more easily than holes, the third light emitting dopant and the fourth light emitting dopant can be appropriately selected from the above-mentioned light emitting dopants according to the constituent materials for the hole injecting and transporting layer and the electron injecting and transporting layer, and the combination of the host materials of the light emitting layer. For example, when spiro-DPVBi is used for the hole injecting and transporting layer and the electron injecting and transporting layer, TBADN for the host material of the light emitting layer, and rubrene for the light emitting dopant, rubrene becomes the light emitting dopant which transports holes more easily than electrons. Further for example, when spiro-DPVBi is used for the hole injecting and transporting layer and the electron injecting and transporting layer, TBADN for the host material of the light emitting layer, and anthracenediamine for the light emitting dopant, anthracenediamine becomes the light emitting dopant which transports electrons more easily than holes.

Whether the light emitting layer containing the host material and the light emitting dopant is a layer which transports holes more easily than electrons or is a layer which transports electrons more easily than holes can be confirmed by evaluating the angle dependency of light emitting spectrum emission pattern of the obtained organic EL element which contains the host material and a single light emitting dopant. In other words, it can be confirmed by the wavelength of the light emitting spectrum, refractive index of materials, optical path length until the light is taken out from the light emitting layer in the organic EL element and angle dependency of emission pattern.

When the light emitting layer contains the third light emitting dopant which transports holes more easily than electrons and the fourth light emitting dopant which transports electrons more easily than holes, the respective concentration of the third light emitting dopant and the fourth light emitting dopant preferably has concentration gradient which continuously change to the thickness direction of the light emitting layer. Further, it is also preferable that the light emitting layer has a region with relatively high concentration and a region with relatively low concentration of the respective third light emitting dopant and fourth light emitting dopant. Thereby, holes and electrons injected into the light emitting layer can be balanced out.

When the third light emitting dopant and the fourth light emitting dopant of the light emitting layer have concentration gradient, they may be as follows: the concentration of the third light emitting dopant may be high at the hole injecting and transporting layer side and the concentration of the fourth light emitting dopant may be high at the electron injecting and transporting layer side; the concentration of the third light emitting dopant may be high at the electron injecting and transporting layer side and the concentration of the fourth light emitting dopant may be high at the hole injecting and transporting layer side; the concentration of the third light emitting dopant and the concentration of the fourth light emitting dopant are both high at the hole injecting and transporting layer side; or the concentration of the third light emitting dopant and the concentration of the fourth light emitting dopant may be high at the electron injecting and transporting layer side.

Among the above, it is preferable that the concentration of the third light emitting dopant which transports holes more easily than electrons is high at the hole injecting and transporting layer side, and the concentration of the fourth light emitting dopant which transports electrons more easily than holes is high at the electron injecting and transporting layer side. Further, it is also preferable that the concentration of the third light emitting dopant which transports holes more easily than electrons is high at the electron injecting and transporting layer side, and the concentration of the fourth light emitting dopant which transports electrons more easily than holes is high at the hole injecting and transporting layer side. Thereby, injection balance of holes and electrons can be effectively taken.

Further, when the light emitting layer has a region with relatively high concentration and a region with relatively low concentration of the respective third light emitting dopant and the fourth light emitting dopant, they may be as follows: a region having relatively high third light emitting dopant concentration is provided to the hole injecting and transporting side and a region having relatively low third light emitting dopant concentration may be provided to the electron injecting and transporting layer side; and a region having relatively low third light emitting dopant concentration may be provided to the hole injecting and transporting side and a region having relatively high third light emitting dopant concentration may be provided to the electron injecting and transporting layer side. Further, a region having relatively high fourth light emitting dopant concentration may be provided to the hole injecting and transporting side and a region having relatively low fourth light emitting dopant concentration may be provided to the electron injecting and transporting layer side; a region having relatively low fourth light emitting dopant concentration may be provided to the hole injecting and transporting side and a region having relatively high fourth light emitting dopant concentration may be provided to the electron injecting and transporting layer side.

Among the above, it is preferable that a region having relatively low third light emitting dopant concentration which transports holes more easily than electrons is provided to the hole injecting and transporting side and a region having relatively high third light emitting dopant concentration is provided to the electron injecting and transporting layer side, while also a region having relatively high fourth light emitting dopant concentration which transports electrons more easily than holes is provided to the hole injecting and transporting side and a region having relatively low fourth light emitting dopant concentration is provided to the electron injecting and transporting layer side. Further, it is also preferable that a region having relatively high third light emitting dopant concentration which transports holes more easily than electrons is provided to the hole injecting and transporting side and a region having relatively low third light emitting dopant concentration is provided to the electron injecting and transporting layer side, while also a region having relatively low fourth light emitting dopant concentration which transports electrons more easily than holes is provided to the hole injecting and transporting side and a region having relatively high fourth light emitting dopant concentration is provided to the electron injecting and transporting layer side. Thereby, injection balance of holes and electrons can be effectively taken.

A thickness of the light emitting layer is not particularly limited as long as it can provide a place for holes and electrons to rebind. For example, the thickness may be set about 1 nm to 200 nm. In particular, in order to improve luminous efficiency by improving injection balance of holes and electrons through thickening the thickness of the light emitting layer, the thickness of the light emitting layer is preferably within the range between 10 nm to 100 nm, and more preferably within the range between 30 nm to 80 nm.

As a film forming method of the light emitting layer, a dry method such as vacuum deposition method and a sputtering, and a wet method such as printing method, ink-jet method, spin coating method, casting method, dipping method, bar coating method, blade coating method, roll coating method, gravure coating method, flexo printing method, and spray coating can be cited.

Further, when patterning the light emitting layer, color-coding by masking pixels, which is to be different colors, or deposition may be conducted, or alternatively, barrier may be formed between light emitting layers. As a constituent material for the barrier, a photosetting type resin such as a photosensitive polymide resin and an acrylate based resin, a thermal curing resin, or an inorganic material can be used. Further, a treatment to change the surface energy (wettability) of the barrier may be conducted.

Further, as a film forming method of the light emitting layer which contains the host material and the light emitting dopant, a method of codepositing the host material and the light emitting dopant is preferably used.

When a thin film can be formed by coating a solution, a method such as a spin coating or dip coating can be used as a film forming method of the light emitting layer which contains the host material and the light emitting dopant. In this case, the host material and the light emitting dopant may be dispersed into an inactive polymer.

Still further, when distribution is provided to the light emitting dopant concentration of the light emitting layer, a method of continuously or periodically changing the deposition speed of the host material and the light emitting dopant can be used for example.

5. Second Hole Injecting and Transporting Layer

In the present invention, a second hole injecting and transporting layer may be formed between the hole injecting and transporting layer and the light emitting layer. In this case, the respective ionization potentials and electron affinities of the constituent materials for each of the hole injecting and transporting layer, second hole injecting and transporting layer, and light emitting layer preferably fulfills the above-mentioned relations.

When the second hole injecting and transporting layer may be formed between the hole injecting and transporting layer and the light emitting layer, normally, the hole injecting and transporting layer functions as the hole injecting layer and the second hole injecting and transporting layer functions as the hole transporting layer.

A constituent material for the second hole injecting and transporting layer is not particularly limited as long as it is a material which can stably transport the holes injected from the anode to the light emitting layer. Apart from the compounds listed as the light emitting material for the above-mentioned light emitting layer, arylamines, starburst type amines, phthalocyanins, oxides such as vanadium oxide, molybdenum oxide, ruthenium oxide, aluminum oxide, a conductive polymers such as amorphous carbon, polyaniline, polythiophene, polyphenylenevinylene and derivatives thereof can be used. The conductive polymers such as polyaniline, polythiophene and polyphenylenevinylene and derivatives thereof may have an acid doped. More specifically, substances such as N,N'-bis(naphthalene-1-yl)-N,N'-bis (phenyl)-benzidine (α-NPD), 4,4,4-tris(3-methylphenylamino)triphenylamine (MTDATA), poly(3,4-ethylenedioxithiophene)/polystyrene sulfonate (PEDOT/PSS) and polyvinyl carbazole (PVCz) can be cited.

In particular, the constituent material for the second hole injecting and transporting layer is preferably a bipolar material. By using the bipolar materials for the second hole injecting and transporting layer, deterioration at interfaces of the light emitting layer and the second hole injecting and transporting layer during driving can be efficiently restrained.

As the bipolar material are explained in the above-mentioned section of the hole injecting and transporting layer, explanation here is omitted.

When all of the hole injecting and transporting layer, second hole injecting and transporting layer, second electron injecting and transporting layer, and electron injecting and transporting layer contain the bipolar material, the bipolar material contained in each of them may be identical or different. Further, when all of the hole injecting and transporting layer, second hole injecting and transporting layer, second electron injecting and transporting layer, electron injecting and transporting layer, and light emitting layer contain the bipolar material, the bipolar material contained in each of them may be identical or different.

As the thickness and the film forming method of the second hole injecting and transporting layer are the same as those explained in the above-mentioned hole injecting and transporting layer, explanations here are omitted.

6. Second Electron Injecting and Transporting Layer

In the present invention, the second electron injecting and transporting layer may be formed between the electron injecting and transporting layer and the light emitting layer. In this case, the respective ionization potentials and electron affinities of the constituent materials for the electron injecting and transporting layer, the second electron injecting and transporting layer, and the light emitting layer preferably fulfill the above-mentioned relations.

When the second electron injecting and transporting layer is formed between the electron injecting and transporting layer and the light emitting layer, normally, the electron injecting and transporting layer functions as the electron injecting layer, and the second electron injecting and transporting layer functions as the electron transporting layer.

As a constituent material of the second electron injecting and transporting layer, it is not particularly limited as long as the material can stably transport electrons injected from the cathode to the light emitting layer. For example, phenanthroline derivatives such as bathocuproin (BCP), bathophenanthroline (Bpehn), triazole derivatives, oxadiazole derivatives and aluminum quinolinol complexes such as tris(8-hydroxyquinolinolato)aluminum (Alq3) can be cited.

In particular, the constituent material for the second electron injecting and transporting layer is preferably a bipolar material. By using the bipolar material for the second electron injecting and transporting layer, deterioration at the interfaces of the light emitting layer and the second electron injecting and transporting layer during driving can be effectively restrained.

As the bipolar material is explained in the above-mentioned section of the hole injecting and transporting layer, explanation here is omitted.

As the film forming method and the thickness of the second electron injecting and transporting layer are the same as those explained in the above-mentioned electron injecting and transporting layer, explanations here are omitted.

7. Anode

An anode used in the present invention may be transparent or opaque. When taking the light out from the anode side, the anode needs to be a transparent electrode.

As the anode, it is preferable to use a conductive material having a large work function for facilitating the hole injection. Further, it is preferable that the anode has a resistance as small as possible and a metal material is generally used therefor. Organic or inorganic compounds can also be used. Specifically, tin oxide, indium tin oxide (ITO), indium oxide and the like can be cited.

Anode can be formed by a general electrode forming method. For example, methods such as a sputtering method, vacuum deposition method, and ion-plating method can be cited.

Further, a thickness of the anode is appropriately selected depending on the resistance value and visible light transmission targeted, and a kind of the conductive material.

8. Cathode

A cathode used in the present invention may be transparent or opaque. When taking the light out from the cathode side, the cathode needs to be a transparent electrode.

For the cathode, it is preferable to use a conductive material having a small work function for facilitating the electron injection. Further, it is preferable that the cathode has a resistance as small as possible and a metal material is generally used therefor. Organic or inorganic compounds can also be used. Specifically, Al, Cs or Er can be cited as an example of a single compound; MgAg, AlLi, AlMg and CsTe can be cited as an example of an alloy; and Ca/Al, Mg/Al, Li/Al, Cs/Al, $Cs_2O$/Al, LiF/Al, and $ErF_3$/Al can be cited as an example of a laminate.

Cathode can be formed by a general electrode forming method. For example, methods such as a sputtering method, vacuum deposition method, and ion-plating method can be cited.

Further, a thickness of the cathode is appropriately selected depending on the resistance value and visible light transmission targeted, and a kind of the conductive material.

9. Substrate

A substrate of the present invention is to support members such as the above-mentioned anode, hole injecting and transporting layer, light emitting layer, electron injecting and transporting layer, and the cathode. When the anode or the cathode has the predetermined strength, the anode or the cathode may function as the substrate, however, the anode or the cathode is normally formed on the substrate which has the predetermined strength. Further, in generally producing an organic EL element, an organic EL element can be more stably laminated from the anode side. Thus, an organic EL element is normally laminated in the order of an anode, a hole injecting and transporting layer, a light emitting layer, an electron injecting and transporting layer, and a cathode on a substrate.

The cathode used in the present invention may be transparent or opaque. When taking the light out from the substrate side, the substrate needs to be a transparent substrate. As a transparent substrate, for example, a glass substrates such as a soda lime glass, an alkaline glass, a lead alkaline glass, a borosilicate glass, an alumino silicate glass, and a silica glass; or a resin substrate capable of being shaped as a film can be cited.

II. Second Embodiment

An organic EL element of the second embodiment of the present invention comprises: plural light emitting units, which respectively having a hole injecting and transporting layer, a light emitting layer and an electron injecting and transporting layer sequentially laminated, between an anode and a cathode facing each other; and a charge generating layer formed between adjacent light emitting units, characterized in that a relation of $Ip_2 \geq Ip_3$ is established when an ionization potential of a constituent material for the light emitting layer is $Ip_2$ and an ionization potential of a constituent material for the electron injecting and transporting layer is $Ip_3$, and characterized in that a relation of $Ea_1 \geq Ea_2$ is established when an electron affinity of a constituent material for the hole injecting and transporting layer is $Ea_1$ and an electron affinity of the constituent material for the light emitting layer is $Ea_2$.

An organic EL element of the present embodiment will be explained with reference to the drawings.

Figure 8:
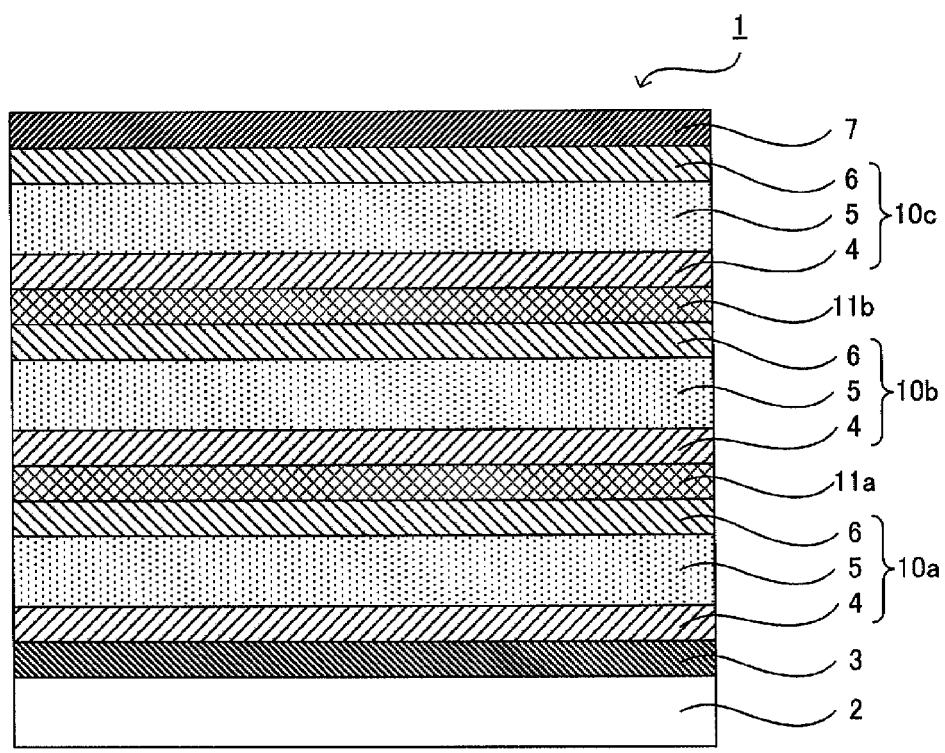
FIG. 8 is a schematic cross-sectional view illustrating another embodiment of the organic EL element of the present invention.
Figure 9:
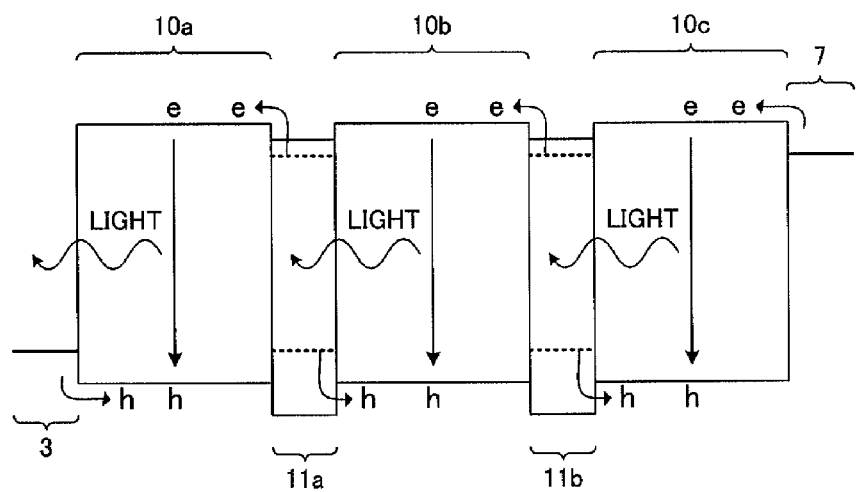
FIG. 9 is an explanation diagram illustrating an action mechanism of the organic EL element of the present invention.

FIG. 8 is a schematic cross-sectional view illustrating an example of the organic EL element of the present embodiment. FIG. 9 is an explanation diagram illustrating the action mechanism of the organic EL element shown in FIG. 8.

As shown in FIG. 8, an organic EL element 1 comprises an anode 3, a light emitting unit 10a, a charge generating layer 11a, a light emitting unit 10b, a charge generating layer 11b, a light emitting unit 10c and a cathode 7 sequentially laminated on a substrate 2. In other words, the light emitting units and the charge generating layers are repeatedly formed between the anode and the cathode. In general, in an organic EL element, holes (h) are injected from the anode side and electrons (e) are injected from the cathode side, and holes and electrons injected are rebound in a light emitting unit to generate an excited state and emit light. In the above-mentioned organic EL element, three light emitting units 10a, 10b and 10c are laminated via charge generating layers 11a and 11b. As shown in FIG. 9, holes (h) are injected from the anode 3 side and electrons (e) are injected from the cathode 7 side. Further, holes (h) are injected to the cathode 7 direction by the charge generating layers 11a and 11b, and electrons (e) are injected to the anode 3 direction. Holes and electrons injected are rebound in each of the light emitting units 10a, 10b and 10c, and plural light emissions are generated between the anode 3 and the cathode 7.

Moreover, each of the light emitting units 10a, 10b and 10c has a hole injecting and transporting layer 4, a light emitting layer 5 and an electron injecting and transporting layer 6 laminated in this order from the anode 3 side.

The hole injection denotes a generation of radical cation caused by a withdrawal of electrons from the valence band of a layer. Electrons withdrawn from the valence band of the hole injecting and transporting layer contacting to the cathode side of the charge generating layer is reutilized for generating the light emitting-excited state by being injected into the conductive band of the electron injecting and transporting layer contacting to the anode side of the charge generating layer. In the charge generating layer, by respectively shifting the radical anion state (electrons) and the radical cationic state (holes) to the anode direction and to the cathode direction when voltage is applied, electrons are injected to the light emitting unit contacting to the anode side of the charge generating layer and holes are injected to the light emitting unit contacting to the cathode side of the charge generating layer. In other words, when a voltage is applied between the anode and the cathode, simultaneous to the injection of the holes from the anode side and the injection of the electrons from the cathode side, electrons and holes are generated in the charge generating layer, separated from the charge generating layer, electrons generated in the charge generating layer move to the anode direction and are injected into the adjacent light emitting unit, and the holes generated in the charge generating layer move to the cathode direction and are injected into the adjacent light emitting unit. These electrons and holes are subsequently rebound in the light emitting unit to emit light.

Therefore, in the present embodiment, when a voltage is applied between the anode and the cathode, each light emitting units is connected in-line and simultaneously emits light so that a high current efficiency can be realized.

In an organic EL element having a structure where a single light emitting unit is sandwiched between an anode and a cathode (hereinafter, referred as an organic EL element having a single light emitting unit), an upper limit of the quantum efficiency which is "a ratio of photon (number)/second against electrons (number) measured by an external circuit/second" has been 1(=100%) theoretically. In contrast, there is no theoretical limit in the organic EL element obtained in the present embodiment. This is because, as explained above, the injection of holes (h) illustrated in FIG. 9 denotes a a withdrawal of electrons from the valence band of the light emitting units 10b and 10c, and electrons withdrawn from the valence band of the light emitting units 10b and 10c contacting to the cathode 7 side of the charge generating layers 11a and 11b are reutilized for generating the light emitting-excited state by being injected into the conductive band of the light emitting units 10a and 10b contacting to the anode 3 side of the charge generating layers 11a and 11b. Thus, summation of the quantum efficiency of the each light emitting units laminated via the charge generating layer (in this case, defined as the ratio between the electrons (number) (apparently) passing through each light emitting units/second and the photons (number) discharged from each light emitting units/second) becomes the quantum efficiency of the organic EL element obtained in the present embodiment so that there is no upper limit to the value thereof.

Further, a luminance of the organic EL element having a single light emitting unit is almost proportionate to the current density and a high current density is naturally needed to obtain a high luminance. On the other hand, the lifetime of the element is inversely proportionate to the current density but not the driving voltage so that the light emission at a high luminance shortens the element lifetime. In contrast to these, the organic EL element of the present embodiment can realize, for example, nth luminance without raising the current density by making the number of the light emitting units having the same structure presented in between the anode and the cathode "n" when nth luminance is aimed at a desired current density. The nth luminance can be realized without sacrificing the lifetime of the organic EL element.

Further, in the organic EL element having a single light emitting unit, a power conversion efficiency (W/W) is lowered by the elevation of a driving voltage. In contrast to these, the organic EL element of the present embodiment, a power conversion efficiency (W/W) does not change in principle because, when "n" units of the light emitting unit are to be presented between the anode and the cathode, other factors such as a light emission starting voltage (turn on Voltage) also becomes nearly nth, and quantum efficiency (current efficiency) becomes nearly nth although a voltage to obtain a desired luminance also becomes nearly nth.

The present embodiment also has an advantage to reduce the risk of causing element short circuit because plural layers of the light emitting units exist. In case of the organic EL element having a single light emitting unit, on the other hand, since it has only one light emitting unit, there is a risk of instantly becoming a non-light emitting element when an (electric) short circuit is occurred between the anode and the cathode by factors such as the influence of pinhole presented in the light emitting unit. In contrast thereto, in case of the organic EL element of the present embodiment, a risk of short circuit can be lowered because it is thick since plural light emitting units are laminated between the anode and the cathode. Further, even if a specific light emitting unit is short circuited, other light emitting units are capable of emitting light and therefore, non-light emission can be avoided. In particular, if the organic EL element is driven by constant current, the driving voltage is only lowered by the amount of the short circuited-light emitting unit(s) so that other light emitting units not short circuited can emit light in normal order.

Further for example, when an organic EL element is used for a display device having a simple matrix structure, the voltage depression and the temperature rising of a substrate caused by wire resistance can be remarkably reduced, compare to the case of using an organic EL element having a single light emitting unit, by decreasing the current density. In this respect, the organic EL element of the present embodiment is advantageous.

Still further for example, the above-mentioned characteristics work very advantageously for the case of using the organic EL element to emit light uniformly in a large area, in particular the case of using the element for lightning. In the organic EL element having a single light emitting unit, the specific resistance of the transparent electrode material (to $10^{-4}$ Ω·cm) such as an electrode material, particularly typified by ITO, is higher by about double-digit compare to the specific resistance of a metal (to $10^{-6}$ Ω·cm). Thus, as a distance from the power feeding part becomes longer, a voltage (V) (or electric field E (V/cm)) applied to the light emitting unit lowers. As a result, there is a risk of causing a luminance irregularity (luminance difference) between areas nearby the power feeding part and the area distanced therefrom. In contrast thereto, in case of the organic EL element of the present embodiment, it is possible to consequently emit light almost uniformly in a large area in obtaining a desired luminance, because a current value can be remarkably reduced compare to that of the organic EL element having a single light emitting unit and potential dropping can be also reduced.

Figure 10A:
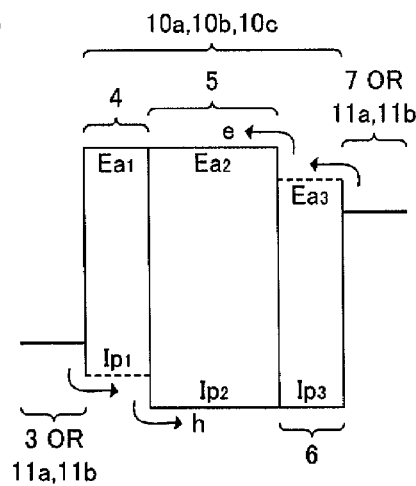
FIGS. 10A and 10B are each a pattern diagram showing another embodiments of the band diagram of the organic EL element of the present invention.
Figure 10B:
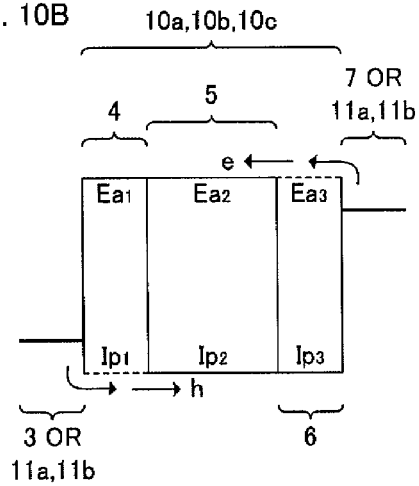

FIGS. 10A and 10B are each a pattern diagram showing one example of the band diagram of the light emitting unit of the organic EL element shown in FIG. 8.

In the organic EL element, the relation may be $Ip_2 > Ip_1$ and $Ip_2 > Ip_3$ as shown in FIG. 10A or be $Ip_1 = Ip_2 = Ip_3$ as shown in FIG. 10B, when the ionization potential of the constituent material for the hole injecting and transporting layer 4 is the ionization potential of the constituent material for the light emitting layer 5 is $Ip_2$, the ionization potential of the constituent material for the electron injecting and transporting layer 6 is $Ip_3$. Further, the relation may be $Ea_1 > Ea_2$ and $Ea_3 > Ea_2$ as shown in FIG. 10A or be $Ea_1 = Ea_2 = Ea_3$ as shown in FIG. 10B, when the electron affinity of the constituent material for the hole injecting and transporting layer 4 is $Ea_1$, the electron affinity of the constituent material for the light emitting layer 5 is $Ea_2$, and the electron affinity of the constituent material for the electron injecting and transporting layer 6 is $Ea_3$.

In the present invention, since the relation of the ionization potentials of the respective constituent material for the electron injecting and transporting layer and light emitting layer is $Ip_2 \geq Ip_3$, and the relation of electron affinities of the respective constituent materials for the hole injecting and transporting layer and light emitting layer is $Ea_1 \geq Ea_2$, similar to the above-mentioned first embodiment, deterioration at interfaces of the hole injecting and transporting layer, the light emitting layer, and the electron injecting and transporting layer caused during the driving can be restrained. Therefore, a highly efficient and long-lasting organic EL element can be obtained.

Figure 11:
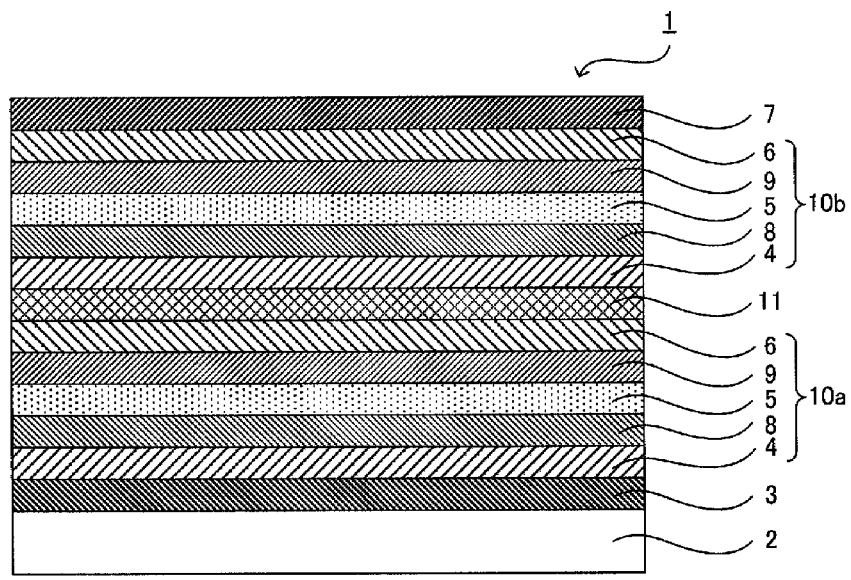
FIG. 11 is a schematic cross-sectional view illustrating yet another embodiment of the organic EL element of the present invention.

In the present embodiment, a second hole injecting and transporting layer 8 may be formed between the hole injecting and transporting layer 4 and the light emitting layer 5 as shown in FIG. 11, or a second electron injecting and transporting layer 9 may be formed between the electron injecting and transporting layer 6 and the light emitting layer 5.

Figure 12A:
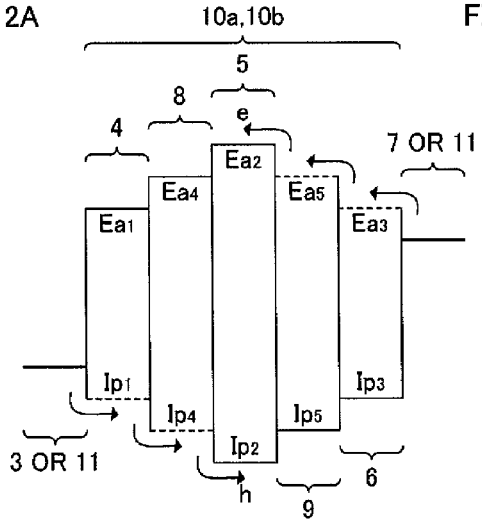
FIGS. 12A and 12B are each a pattern diagram showing another embodiments of the band diagram of the organic EL element of the present invention.
Figure 12B:
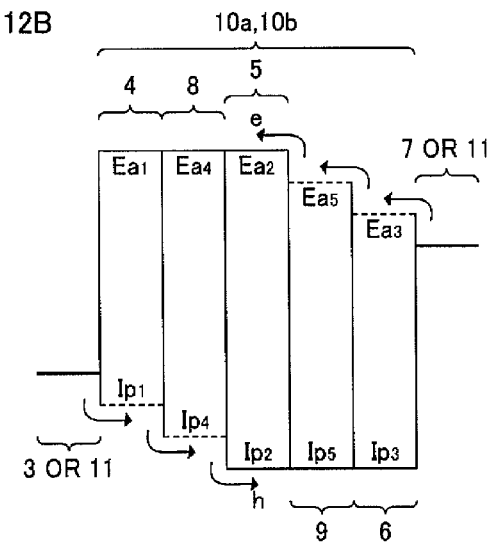

FIGS. 12A and 12B are each a pattern diagram showing one example of the band diagram of the light emitting unit of the organic EL element shown in FIG. 11.

In the organic EL element, the relation may be $Ip_2 > Ip_4 > Ip_1$ and $Ip_2 > Ip_5 > Ip_3$ as shown in FIG. 12A or be $Ip_2 > Ip_4 > Ip_1$ and $Ip_2 = Ip_5 = Ip_3$ as shown in FIG. 12B, when the ionization potential of the constituent material for the hole injecting and transporting layer 4 is $Ip_1$, the ionization potential of the constituent material for the second hole injecting and transporting layer 8 is $Ip_4$, the ionization potential of the constituent material for light emitting layer 5 is $IP_2$, the ionization potential of the constituent material for the electron injecting and transporting layer 6 is $Ip_3$, and the ionization potential of the constituent material for the second electron injecting and transporting layer 9 is $Ip_5$. Further, the relation may be $Ea_1 > Ea_4 > Ea_2$ and $Ea_3 > Ea_5 > Ea_2$ as shown in FIG. 12A or be $Ea_1 = Ea_4 = Ea_2$ and $Ea_3 > Ea_5 > Ea_2$ as shown in FIG. 12B, when the electron affinity of the constituent material for the hole injecting and transporting layer 4 is $Ea_1$, the electron affinity of the constituent material for the second hole injecting and transporting layer 8 is $Ea_4$, the electron affinity of the constituent material for the light emitting layer 5 is $Ea_2$, the electron affinity of the constituent material for the electron injecting and transporting layer 6 is $Ea_3$, and the electron affinity of the constituent material for the second electron injecting and transporting layer 9 is $Ea_5$.

In such organic EL element, since the relation of the ionization potentials of the respective constituent material for the electron injecting and transporting layer, second electron injecting and transporting layer, and light emitting layer is $Ip_2 \geq Ip_5 \geq Ip_3$, and the relation of electron affinities of the respective constituent materials for the hole injecting and transporting layer and transporting layer, second hole injecting and transporting layer, and light emitting layer is $Ea_1 \geq Ea_4 \geq Ea_2$, similar to the above-mentioned case, deterioration at interfaces of the hole injecting and transporting layer, second hole injecting and transporting layer, light emitting layer, second electron injecting and transporting layer, and electron injecting and transporting layer caused during the driving can be restrained. Therefore, a highly efficient and long-lasting organic EL element can be obtained.

Further, when the bandgap energy of the constituent material for the light emitting layer is relatively big, and the difference between the ionization potential of the constituent material for the hole injecting and transporting layer $Ip_1$ and the ionization potential of the constituent material for the light emitting layer $Ip_2$ is relatively big, by forming the second hole injecting and transporting layer between the hole injecting and transporting layer and the light emitting layer in such a manner so as the relation becomes $Ip_1 < Ip_4 < Ip_2$, holes can be smoothly transported from the hole injecting and transporting layer to the second hole injecting and transporting layer via the light emitting layer.

On the other hand, when the bandgap energy of the constituent material for the light emitting layer is relatively big, and the difference between the electron affinity of the constituent material for the electron injecting and transporting layer $Ea_3$ and the electron affinity of the constituent material for the light emitting layer $Ea_2$ is relatively big, by forming the second electron injecting and transporting layer between the electron injecting and transporting layer and the light emitting layer in such a manner so as the relation becomes $Ea_2 < Ea_5 < Ea_3$, electrons can be smoothly transported from the electron injecting and transporting layer to the s light emitting layer via the second electron injecting and transporting layer.

In the present embodiment, the light emitting positions are separated intermittently and presented by plural numbers. In a conventional organic EL element wherein plural light emitting units are laminated via charge generated layer (multi photon-emission), interference effect becomes remarkable as the element thickness becomes thicker so that there has been a problem that the color tone (that is, the emission spectrum shape) changes a lot. More specifically, the emission spectrum shape is changed, or the luminous efficiency is substantially dropped or the angle dependency is caused in emission pattern as a result of the emission at the emission peak position is canceled out by the pronounced interference effect. In general, problems associated with the interference effect can be responded by controlling the optical thickness between the light emitting positions and the reflecting electrode.

However, even the front luminance can be improved by controlling the optical thickness, such organic EL element has a tendency to lower its luminance by the interference effect because the optical path length changes in terms of luminance from a tilt angle.

In the present embodiment, unlike the conventional organic EL element where holes and electrons dominantly rebind at an interface between the light emitting layer and the blocking layer, holes and electrons rebind in the whole light emitting layer so that it can improve the viewing angle dependency of the emission color compare to the conventional multi-photon emission.

Hereinafter, each structure of the organic EL element of the present embodiment will be explained. As the anode, the cathode and the substrate are the same to those explained in the above-mentioned first embodiment, explanations here are omitted.

1. Charge Generating Layer

In the present embodiment, a charge generating layer denotes an electric insulating layer having the predetermined specific resistance, which injects holes to the cathode direction and electrons to the anode direction of the element when a voltage is applied.

It is preferable that the charge generating layer has the specific resistance of $1.0 \times 10^2$ Ω·cm or more, and more preferably of $1.0 \times 10^5$ Ω·cm or more.

Further, the charge generating layer preferably has the visible light transmission of 50% or more. This is because, when the visible light transmission is less than the above-mentioned range, the generated light is to be absorbed when it transmits through the charge generating layer so that there is a possibility that the desired quantum efficiency (current efficiency) may not be obtained even if the organic EL element has plural light emitting units.

A material used for the charge generating layer is not particularly limited as long as the material has the above-mentioned specific resistance. An inorganic or organic material can be used therefore.

In particular, it is preferable that the charge generating layer contains two different substances which can form by oxidation-reduction reaction a charge-transfer complex made of a radical cation and a radical anion. Between these two substances, a charge-transfer complex made of a radical cation and a radical anion is formed by oxidation-reduction reaction. By the radical cationic state (holes) and the radical anionic state (electrons) of the charge-transfer complex respectively moving to the cathode direction or anode direction when a voltage is applied, holes are injected to a light emitting unit contacting to the cathode side of the charge generating layer and electrons are injected to a light emitting unit contacting to the anode side of the charge generating layer.

The charge generating layer may be a layer wherein layers respectively made of these two different substances are laminated, or a single layer which contains the two different substances.

The two different substances used for the charge generating layer is preferably: (a) an organic compound whose ionization potential is smaller than 5.7 eV and has hole transportation properties, i.e., electron donating properties, and (b) an inorganic or organic material which can form a charge-transfer complex by oxidation-reduction reaction with the above-mentioned organic compound (a). Further, a charge-transfer complex is preferably formed by oxidation-reduction reaction between the (a) and (b) components.

Whether or not the two substances constituting the charge generating layer can form the charge-transfer complex by oxidation-reduction reaction can be confirmed by a spectrographic analysis. More specifically, when a mixed film of the two substances shows its peak in absorbing spectrum within the near-infrared area of wavelength of 800 nm to 2000 nm, even if each of the two substances alone does not show its peak in absorbing spectrum within the near-infrared area of wavelength of 800 nm to 2000 nm, formation of the charge-transfer complex by oxidation-reduction reaction between the two substances can be confirmed as a presence (evidence) clearly suggesting the electron movements between the two substances.

The ionization potential of the organic compound of (a) component is sufficient if it is smaller than 5.7 eV. This is because, in general, an ionization potential smaller than 5.7 eV is preferable for the organic compound having electron donating properties to easily become a radical cationic state. When an ionization potential of the organic compound of (a) component is 5.7 eV or larger, it becomes difficult to cause oxidation-reduction reaction with the substance of (b) component so that formation of charge-transfer complex may become also difficult.

As an example of the organic compound of (a) component, an arylamine compound can be cited. The arylamine compound preferably has a structure shown in below formula (1).

[Chemical Formula 4]

(1)

Here, in the above-mentioned formula, $Ar^1$, $Ar^2$ and $Ar^3$ each represent independently an aromatic hydrocarbon group which may have a substituent.

As such arylamine compound, for example, those arylamine compounds disclosed in the Japanese Patent Application Publication (JP-A) No. 2003-272860 can be used.

Further, as the substance of (b) component, for example, substances such as $V_2O_5$, $Re_2O_7$, and 4F-TCNQ can be cited. The substance of (b) component may be a material used for the hole injecting and transporting layer.

The charge generating layer is further explained in detail in JP-A No. 2003-272860.

2. Light Emitting Unit

Light emitting units of the present embodiment are formed by plural numbers between an anode and a cathode facing each other, and are units, each of which has the hole injecting and transporting layer, light emitting layer and electron injecting and transporting layer laminated sequentially. Further, the respective ionization potentials and the respective electron affinity of constituent materials for each of the hole injecting and transporting layer, light emitting layer, and electron injecting and transporting layer constituting a light emitting unit fulfills the predetermined relations.

Further, in each light emitting unit, the second hole injecting and transporting layer may be formed between the light emitting layer and the hole injecting and transporting layer. In this case, it is preferable that the respective ionization potentials and the respective electron affinity of constituent materials for each of the hole injecting and transporting layer, second hole injecting and transporting layer, and light emitting layer fulfills the predetermined relations.

Further, the second electron injecting and transporting layer may be formed between the light emitting layer and the electron injecting and transporting layer. In this case, it is preferable that the respective ionization potentials and the respective electron affinity of constituent materials for each of the electron injecting and transporting layer, second electron injecting and transporting layer, and light emitting layer fulfills the predetermined relations.

As the light emitting layer, hole injecting and transporting layer, electron injecting and transporting layer, second hole injecting and transporting layer and second electron injecting and transporting layer are the same as those explained in the first embodiment, explanation here is omitted.

In the present embodiment, plural light emitting units are formed via the charge generating layer. The number of lamination is not particularly limited as long as it is plural, that is at least two, and for example, it may be three layers, four layers or more. The number of the lamination is preferably the kind that a high luminance can be obtained.

Further, a structure of each light emitting unit may be identical or different.

For example, three light emitting units each of which emits red, green, and blue lights can be laminated. In this case, white light is generated. By using an organic EL element emitting such white light for usages such as lightings, a high luminance provided by large area can be obtained.

To make an organic EL element emitting white light, the respective emission strength and color phase of each light emitting unit is selected by combination so as a white light or a light close to white is generated. Combination of the light emitting units which can generate a light that can be seen as white are many other than the above-mentioned combination of red, green, and blue lights. For example, combinations of blue and yellow lights, red and cyan lights, or green and magenta lights can be cited. White light can be generated accordingly by using two light emitting units each of which emits each color. Further, an organic EL element can be obtained by using plural numbers of these combinations.

Moreover, an organic EL element which generates blue light can be applied to a color display device by using a color conversion system. Although there has been a problem that a blue light emitting material has a short lifetime, since the organic EL element of the present embodiment is highly efficient and has a long lifetime, it is advantageous for such a color display device.

The present invention is not limited to the above-mentioned embodiments. The embodiments are merely examples, and any one having the substantially same configuration as the technological idea disclosed in the claims of the present invention and the same effects is included in the technological scope of the present invention.

EXAMPLES

Hereinafter, the present invention will be explained specifically with reference to the examples and the comparative examples.

First, the respective ionization potentials and electron affinities of the materials used in Examples will be shown in the below Table 1.

TABLE 1

| Material | Ig (calculated value) (eV) | Ag (calculated value) (eV) | Is (calculated value) (eV) | As (estimate value) (eV) |
|---|---|---|---|---|
| Spiro-DPVBi | 6.11 | 1.29 | 5.4 | 2.0 |
| TBADN | 6.56 | 0.82 | 5.6 | 1.8 |
| α-NPD | 6.04 | 0.62 | 5.4 | 1.3 |
| Alq3 | 6.71 | 1.01 | 5.7 | 2.0 |
| Anthracenediamine | 6.054 | 1.020 | — | — |
| Rubrene | 6.098 | 1.386 | — | — |
| BAlq | 6.73 | 0.93 | 5.7 | 1.9 |
| CBP | 6.67 | 0.43 | 6.3 | 0.8 |
| Spiro-6P | 6.44 | 1.07 | 5.8 | 1.7 |
| TBPe | 6.56 | 1.44 | — | — |
| DCJTB | 6.31 | 0.82 | — | — |
| Ir(piq)$_3$ | 6.13 | 1.06 | — | — |

In table 1, "Ig", "Ag", "Is", and "As" are as follows.
Ig: ionization potential of a monomolecule.
Ag: electron affinity of a monomolecule.
Is: ionization potential of a film.
As: electron affinity of a film.

The values of "Ig" and "Ag" can be obtained by: optimizing their structures at neutral states by B3LYP/6-31g(d) using the molecular orbital calculation software Gaussian 03™, conducting three sets of energy calculations of positive, negative and neutral charges to the structure by B3LYP/6-311g++(d, p), and by taking the differences thereof.

The value of "Is" can be obtained by measuring the ionization potential of a film, formed by vacuum depositing the material, using UPS (UV photoelectron or the UV photoelectron device AC-2™ or AC-3™ manufactured by RIKEN KEIKI CO., LTD.

For "As", a value obtained by a formula: As=(Ig−Is)+Ag is used because the difference of polarization energy between "Is" and "Ig" takes the same value as first-order approximation to the electrons.

Here, for the discussion of magnitude relation of the respective ionization potentials Ip and electron affinities Ea of constituent materials for each of the hole injecting layer, hole transporting layer, light emitting layer, electron transporting layer, and electron injecting layer, the above-mentioned ionization potential Is of the films and electron affinity As of the films are used respectively as explained in the above-mentioned section of "1. Ionization Potential and Electron Affinity" of the first embodiment. Further, for the discussion of magnitude relation of the respective ionization potentials and electron affinities of constituent materials for the dopant materials and host materials, the above-mentioned ionization potential Ig of a monomolecule and electron affinity Ag of a monomolecule are used as explained in the above-mentioned section of "4. Light Emitting Layer" of the first embodiment.

The above-mentioned ionization potential Is and the electron affinity As contain a measurement error of ±0.1 eV.

Example 1

Production of Organic EL Element

First, an ITO substrate having ITO patterned as an anode in line of 2 mm width on a glass substrate was prepared. A film of spiro-DPVBi and $MoO_3$ was formed by codeposition on the ITO substrate at a ratio by weight of 67:33 under the condition of vacuum degree of $10^{-5}$ Pa so as the total film thickness became 10 nm at the deposition speed of 1.5 Å/sec. Thereby, a hole injecting layer was formed.

Next, Spiro-DPVBi was formed on the hole injecting layer by vacuum depositing under the condition of vacuum degree of $10^{-5}$ Pa so as the total film thickness became 10 nm at the deposition speed of 1.0 Å/sec. Thereby, a hole transporting layer was formed.

Next, a film was formed by vacuum deposition on the hole transporting layer using 3-tert-butyl-9,10-di(naphtha-2-yl)anthracene (TBADN) represented by the below formula (2) as the host material and rubrene represented by the below formula (3) as the light emitting dopant, which was the light emitting center, under the condition of vacuum degree of $10^{-5}$ Pa, so as the rubrene concentration of TBADN and rubrene became 1 wt % and the thickness of the film became 70 nm at the deposition speed of 1.0 Å/sec. Thereby, a light emitting layer was formed.

[Chemical Formula 5]

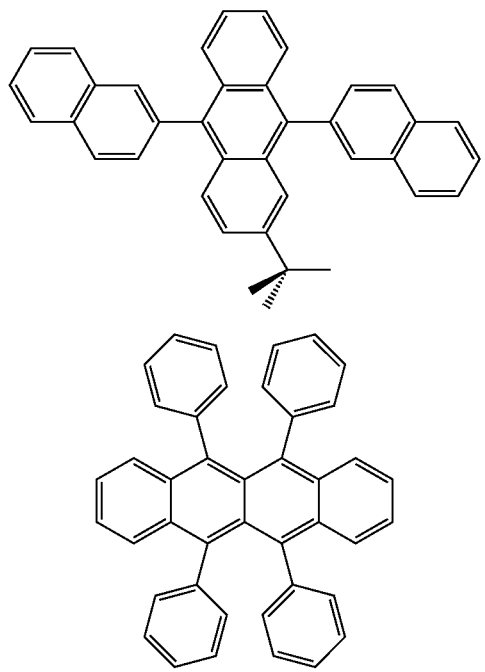

Next, a film was formed on the light emitting layer by vacuum depositing spiro-DPVBi under the condition of vacuum degree of $10^{-5}$ Pa so as a film thickness became 20 nm at the deposition speed of 1.0 Å/sec. Thereby, an electron transporting layer was formed.

Further next, a film was formed on the electron transporting layer by codepositing spiro-DPVBi and Liq represented by the below formula (4) at a ratio by weight of 1:1 under the condition of vacuum degree of $10^{-5}$ Pa so as the film thickness became 12 nm at the deposition speed of 1.0 Å/sec. Thereby, an electron injecting layer was formed.

[Chemical Formula 6]

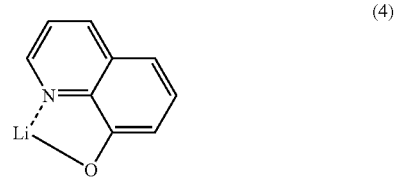

(4)

Lastly, Al was deposited on the electron injecting layer as a cathode to the film thickness of 100 nm at the deposition speed of 5.0 Å/sec.

Comparative Example 1

Production of Organic EL Element

First, an ITO substrate having ITO patterned as an anode in line of 2 min width on a glass substrate was prepared. A film of N,N'-Bis(naphthalen-1-yl)-N,N'-bis(phenyl)-benzidine (α-NPD) represented by the below formula (5) and $MoO_3$ was formed by codeposition on the ITO substrate at a ratio by weight of 75:25 under the condition of vacuum degree of $10^{-5}$ Pa, so as the total film thickness became 10 nm at the deposition speed of 1.25 Å/sec. Thereby, a hole injecting layer was formed.

[Chemical Formula 7]

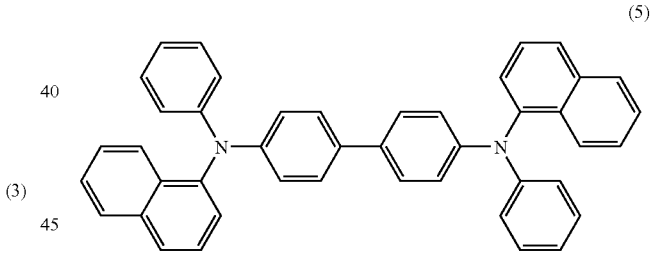

(5)

Next, α-NPD represented by the above formula (5) was formed on the hole injecting layer by vacuum depositing under the condition of vacuum degree of $10^{-5}$ Pa so as the film thickness became 20 nm at the deposition speed of 1.0 Å/sec. Thereby, a hole transporting layer was formed.

Next, a film was formed by vacuum deposition on the hole transporting layer using spiro-DPVBi as the host material and rubrene represented by the below formula (3) as the light emitting dopant, which was the light emitting center, under the condition of vacuum degree of $10^{-5}$ Pa, so as the rubrene concentration of spiro-DPVBi and rubrene became 1 wt % and the thickness of the film became 30 nm at the deposition speed of 1.0 Å/sec. Thereby, a light emitting layer was formed.

Next, a film was formed on the light emitting layer by vacuum depositing Alq3 represented by the below formula (6) under the condition of vacuum degree of $10^{-5}$ Pa so as a film thickness became 30 nm at the deposition speed of 1.0 Å/sec. Thereby, an electron transporting layer was formed.

[Chemical Formula 8]

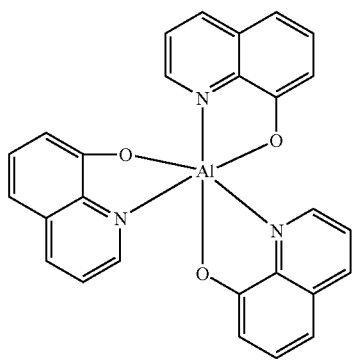

(6)

Then, a film was formed on the electron transporting layer by codepositing Alq3 represented by the above formula (6) and Liq represented by the above formula (4) at a ratio by weight of 1:1 under the condition of vacuum degree of $10^{-5}$ Pa so as the film thickness became 10 nm at the deposition speed of 1.0 Å/sec. Thereby, an electron injecting layer was formed.

Lastly, Al was deposited on the electron injecting layer as a cathode to the film thickness of 100 nm at the deposition speed of 5.0 Å/sec.

(Evaluation)

Figure 13:
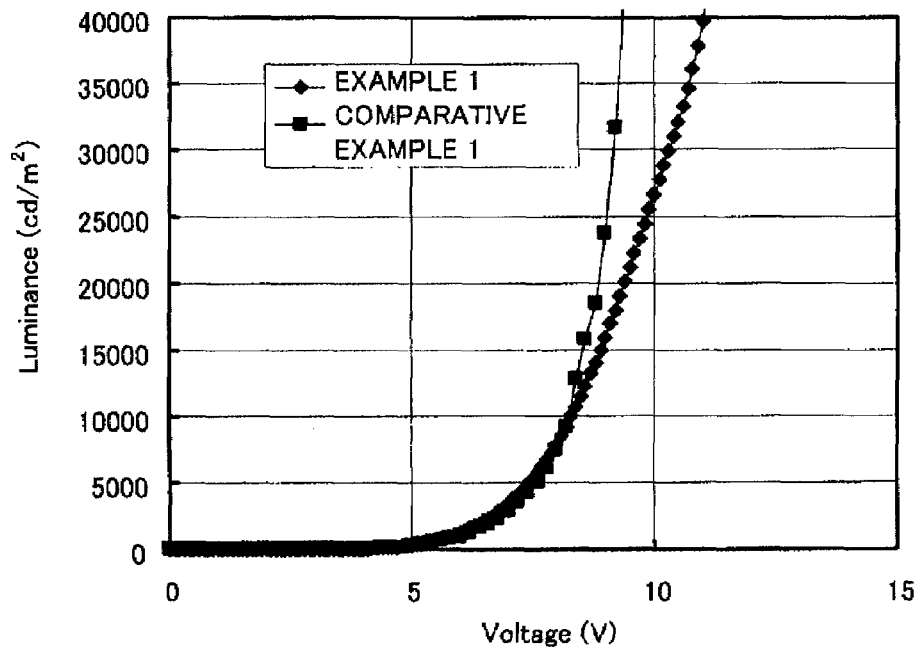
FIG. 13 is a graph illustrating the luminance-voltage properties obtained in the Example 1 and the Comparative Example 1.
Figure 14:
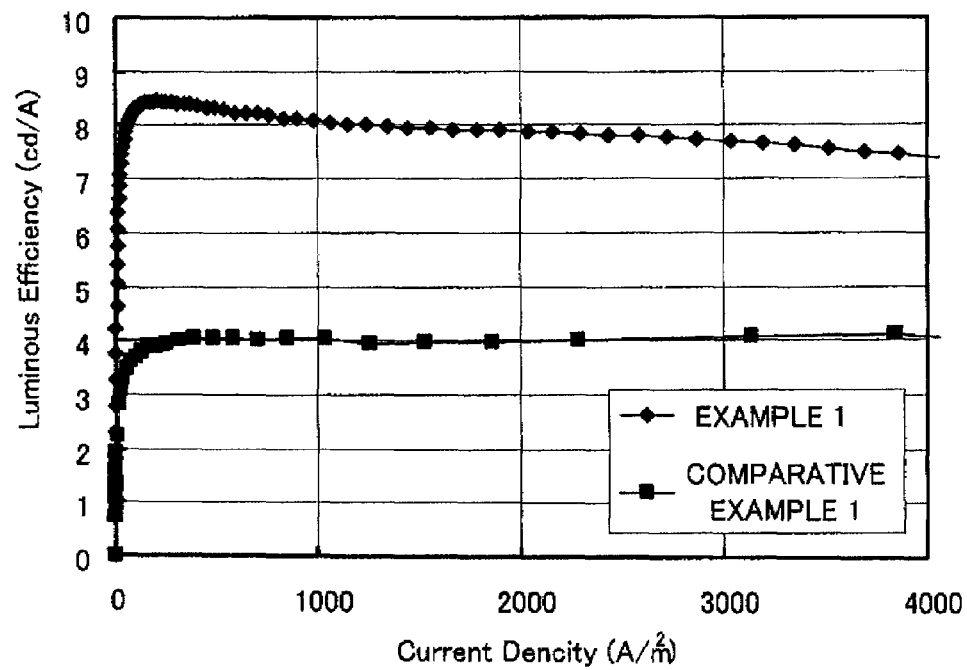
FIG. 14 is a graph illustrating the luminous efficiency-current densities obtained in the Example 1 and the Comparative Example 1.

FIG. 13 and FIG. 14 respectively show the luminance-voltage properties and the luminous efficiency-current density of the organic EL elements obtained in Example 1 and Comparative Example 1.

From organic EL elements obtained in Example 1 and Comparative Example 1, yellow emissions derived from rubrene were observed. In the organic EL element obtained in Example 1, luminous efficiency in the front luminance was 8.4 cd/A, and an external quantum calculated from the number of photons obtained by observing the light emission emitted to all angles and the number of electrons input was 2.3%. On the other hand, in the organic EL element obtained in Comparative Example 1, although excellent luminance-voltage properties were obtained, luminous efficiency in the front luminance was 4.4 cd/A and the external quantum calculated was 1.2%. Further, when the organic EL elements were driven at constant current density of 250 Å/m², the respective lifetime properties were as follows. The organic EL element obtained in Example 1 maintained luminance retention of 100% or higher for 3,700 hours, and the estimated time where the luminance dropped by half was 10,000 hours or longer. On the other hand, the luminance of the organic EL element obtained in Comparative Example 1 dropped by half at 2000 hours.

Example 2

Production of Organic EL Element

An organic EL element was produced in the same manner as Example 1, except the film thickness of the hole transporting layer, light emitting layer and electron transporting layer was made to 20 nm, 35 nm and 45 nm, respectively.

Example 3

Production of Organic EL Element

An organic EL element was produced in the same manner as Example 1, except the film thickness of the hole transporting layer, light emitting layer and electron transporting layer was made to 30 nm, 10 nm and 60 nm, respectively.

(Evaluation)

Figure 15:
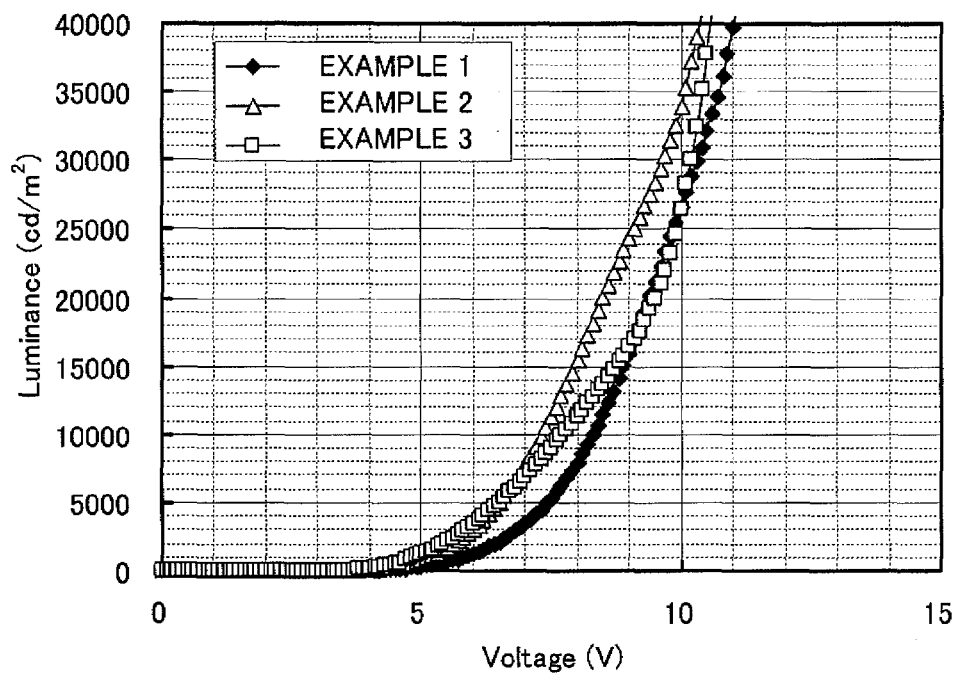
FIG. 15 is a graph illustrating the luminance-voltage properties obtained in the Examples 1 to 3.
Figure 16:
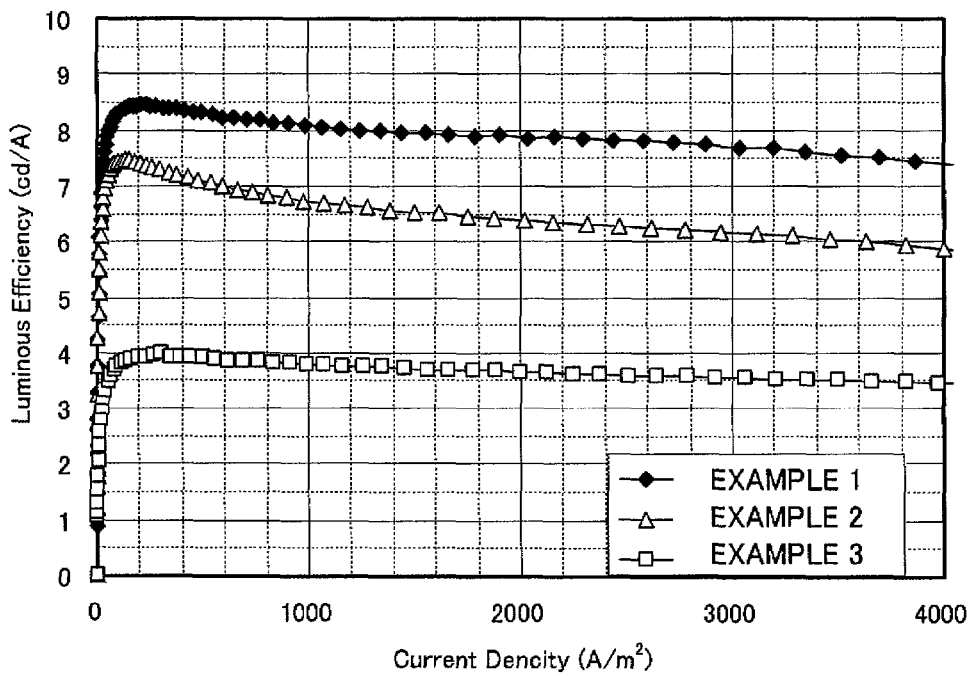
FIG. 16 is a graph illustrating the luminous efficiency-current densities obtained in the Examples 1 to 3.

FIG. 15 and FIG. 16 respectively show the luminance-voltage properties and the luminous efficiency-current density of the organic EL elements obtained in Examples 1 to 3.

When the organic EL elements obtained in Examples 1 to 3 were compared, the organic EL element obtained in Example 2 which had the film thickness of 35 nm for the light emitting layer showed excellent result in luminance-voltage properties, and the organic EL element obtained in Example 1 which had the film thickness of 70 nm for the light emitting layer showed the most excellent luminous efficiency.

Example 4

Production of Organic EL Element

First, an ITO substrate having ITO patterned as an anode in line of 2 mm width on a glass substrate was prepared. A film of spiro-DPVBi and $MoO_3$ was formed by codeposition on the ITO substrate at a deposition by ratio by weight of 67:33 under the condition of vacuum degree of $10^{-5}$ Pa so as the total film thickness became 10 nm at the deposition speed of 1.5 Å/sec. Thereby, a hole injecting layer was formed.

Next, spiro-DPVBi was formed on the hole injecting layer by vacuum depositing under the condition of vacuum degree of $10^{-5}$ Pa so as the film thickness became 10 nm at the deposition speed of 1.0 Å/sec. Thereby, a hole transporting layer was formed.

Next, a film was formed by vacuum deposition on the hole transporting layer using TBADN represented by the above formula (2) as the host material and N,N,N',N'-tetra-p-tolyl-anthracene-9,10-diamine (anthracenediamine) represented by the below formula (7) as the light emitting dopant, which was the light emitting center, under the conditions of vacuum degree of $10^{-5}$ Pa, so as the anthracenediamine concentration of TBADN and anthracenediamine became 5 wt % and the thickness of the film became 70 nm at the deposition speed of 1.1 Å/sec. Thereby, a light emitting layer was formed.

[Chemical Formula 9]

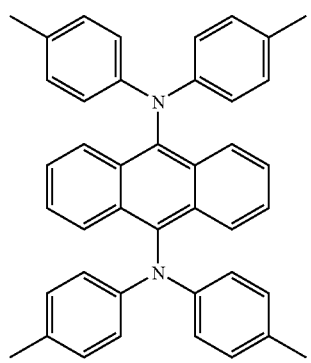

(7)

Next, a film was formed on the light emitting layer by vacuum depositing spiro-DPVBi under the condition of vacuum degree of $10^{-5}$ Pa so as a film thickness became 20 nm at the deposition speed of 1.0 Å/sec. Thereby, an electron transporting layer was formed.

Further next, a film was formed by codepositing spiro-DPVBi and Liq represented by the above formula (4) at a ratio by weight of 1:1 under the condition of vacuum degree of $10^{-5}$ Pa so as the film thickness became 12 nm at the deposition speed of 1.0 Å/sec. Thereby, an electron injecting layer was formed.

Lastly, Al was deposited on the electron injecting layer as a cathode to the film thickness of 100 nm at the deposition speed of 5.0 Å/sec.

(Evaluation)

Figure 17:
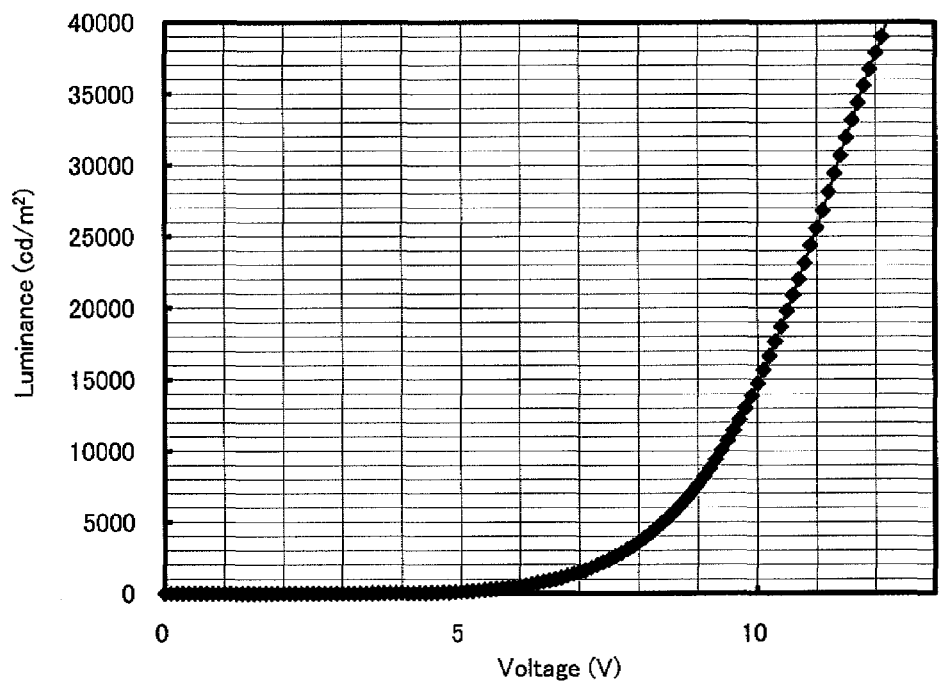
FIG. 17 is a graph illustrating the luminance-voltage properties obtained in the Example 4.
Figure 18:
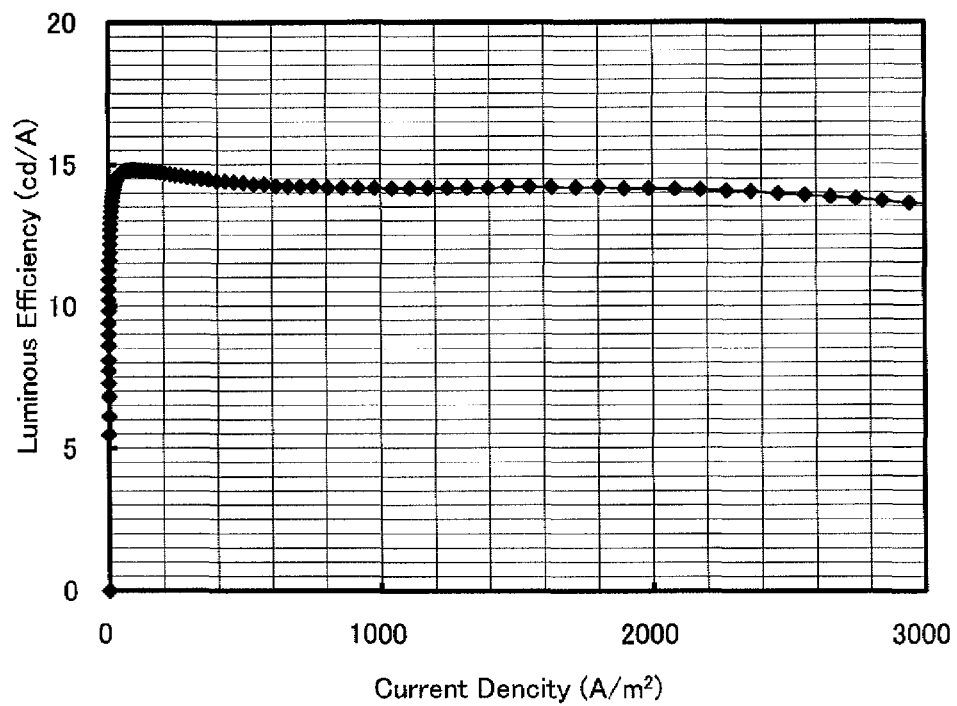
FIG. 18 is a graph illustrating the luminous efficiency-current densities obtained in the Example 4.
Figure 19:
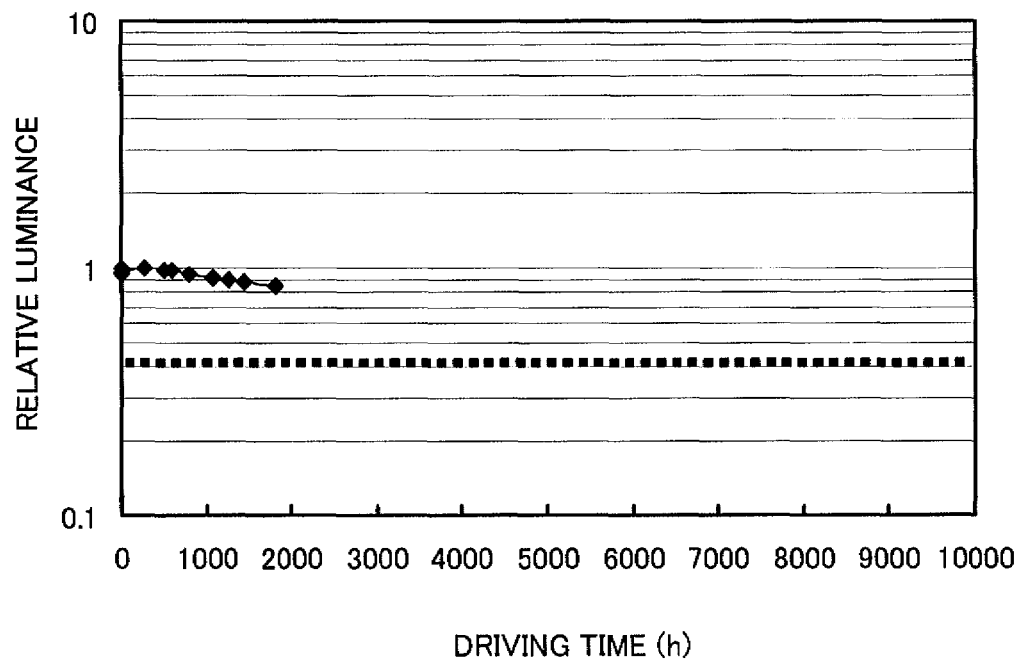
FIG. 19 is a graph illustrating the lifetime properties obtained in the Example 4.

FIG. 17 and FIG. 18 respectively shows the luminance-voltage properties and the luminous efficiency-current density of the organic EL element obtained in Example 4, and FIG. 19 shows its lifetime properties.

From the organic EL element obtained in Example 4, green emission derived from anthracenediamine was observed. Luminous efficiency in the front luminance was 15 cd/A, and an external quantum calculated from the number of photons obtained by observing the light emission emitted to all angles and the number of electrons input was 4.6%. Further, when the organic EL element was driven at constant current density of 250 A/m², the estimated time where the luminance dropped by half was 6,000 hours so that it was confirmed that its lifetime properties was excellent.

Despite a prediction of having an injection barrier at the electron injecting and transporting layer side unlike the result of Example 1, the organic EL element of Example 4 showed improvement in luminous efficiency. From Example 4, it was found out that a highly efficient and long-lasting organic EL element could be obtained by having Ig and Ag of the light emitting dopant in the bandgap of Ig and Ag of host material for the light emitting layer.

Example 5

Production of Organic EL Element

First, an ITO substrate having ITO patterned as an anode in line of 2 mm width on a glass substrate was prepared. A film of spiro-DPVBi and $MoO_3$ was formed by codeposition on the ITO substrate at a ratio by weight of 67:33 under the condition of vacuum degree of $10^{-5}$ Pa so as the total film thickness became 10 nm at the deposition speed of 1.5 Å/sec. Thereby, a hole injecting layer was formed.

Next, spiro-DPVBi was formed on the hole injecting layer by vacuum depositing under the condition of vacuum degree of $10^{-5}$ Pa so as the film thickness became 10 nm at the deposition speed of 1.0 Å/sec. Thereby, a hole transporting layer was formed.

Next, a film was formed by vacuum deposition on the hole transporting layer using TBADN represented by the above formula (2) as the host material and rubrene represented by the above formula (3) as the light emitting dopant, which was the light emitting center, under the condition of vacuum degree of $10^{-5}$ Pa, so as the rubrene concentration of TBADN and rubrene became 1 wt % and the thickness of the film became 70 nm at the deposition speed of 1.0 Å/sec. Thereby, a light emitting layer was formed.

Next, a film was formed on the light emitting layer by vacuum depositing spiro-DPVBi under the condition of vacuum degree of $10^{-5}$ Pa so as a film thickness became 20 nm at the deposition speed of 1.0 Å/sec. Thereby, an electron transporting layer was obtained.

Then, a film was formed on the electron transporting layer by codepositing spiro-DPVBi and Liq represented by the above formula (4) at a ratio by weight of 1:1 under the condition of vacuum degree of $10^{-5}$ Pa so as the film thickness became 12 nm at the deposition speed of 1.0 Å/sec. Thereby, an electron injecting layer was formed. Further next, Al was deposited to the film thickness of 2 nm at the deposition speed of 5.0 Å/sec.

Subsequently, a film of α-NPD represented by the above formula (5) and $MoO_3$ was formed by codeposition on the Al film at a ratio by weight of 4:1 under the condition of vacuum degree of $10^{-5}$ Pa, so as the film thickness became 20 nm at the deposition speed of 1.25 Å/sec. Thereby, a charge generating layer was formed.

Then, a film of spiro-DPVBi and $MoO_3$ was formed by codeposition on the charge generating layer by ratio at a weight of 67:33 under the condition of vacuum degree of $10^{-5}$ Pa, so as the total film thickness became 10 nm at the deposition speed of 1.5 Å/sec. Thereby, a hole injecting layer was formed.

Next, spiro-DPVBi was vacuum deposited on the hole injecting layer under the condition of vacuum degree of $10^{-5}$ Pa, so as the film thickness became 18 nm at the deposition speed of 1.0 Å/sec. Thereby, a hole transporting layer was formed.

Next, a film was formed by vacuum deposition on the hole transporting layer using TBADN represented by the above formula (2) as the host material and rubrene represented by the above formula (3) as the light emitting dopant, which was the light emitting center, under the condition of vacuum degree of $10^{-5}$ Pa, so as the rubrene concentration of TBADN and rubrene became 1 wt % and the thickness of the film became 60 nm at the deposition speed of 1.0 Å/sec. Thereby, a light emitting layer was formed.

Next, a film was formed on the light emitting layer by vacuum depositing spiro-DPVBi under the condition of vacuum degree of $10^{-5}$ Pa so as a film thickness became 27 nm at the deposition speed of 1.0 Å/sec. Thereby, an electron transporting layer was formed.

Then, a film of spiro-DPVBi and Liq represented by the above formula (4) was formed by codeposition on the electron transporting layer at a ratio by weight of 1:1 under the condition of vacuum degree of $10^{-5}$ Pa, so as the film thickness became 20 nm at the deposition speed of 1.0 Å/sec.

Lastly, Al was deposited on the electron injecting layer as a cathode to the film thickness of 100 nm at the deposition speed of 5.0 Å/sec.

(Evaluation)

Figure 20:
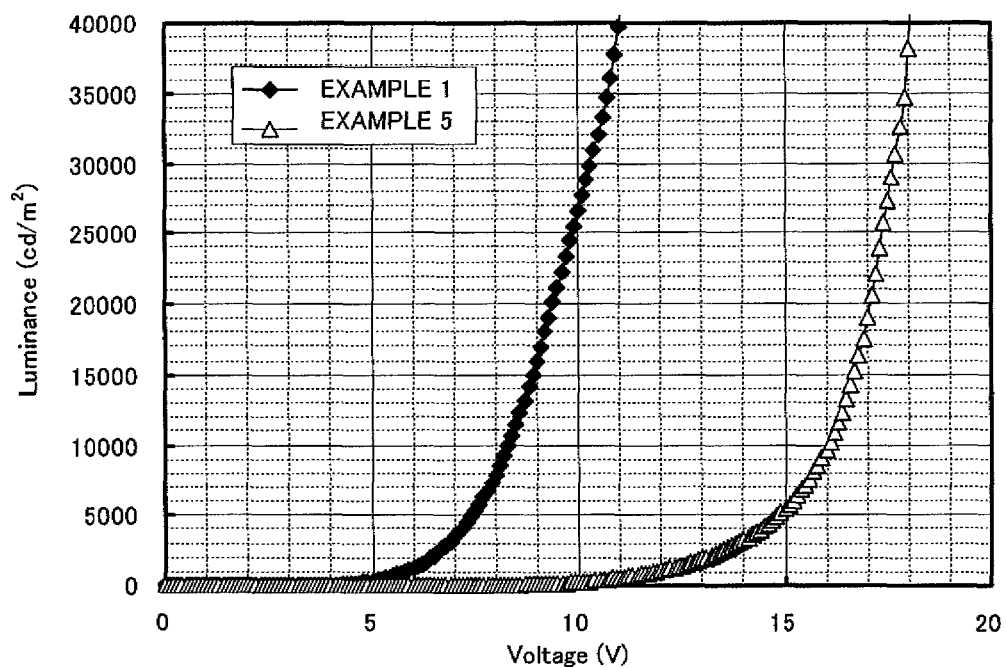
FIG. 20 is a graph illustrating the luminance-voltage properties obtained in the Example 1 and the Example 5.
Figure 21:
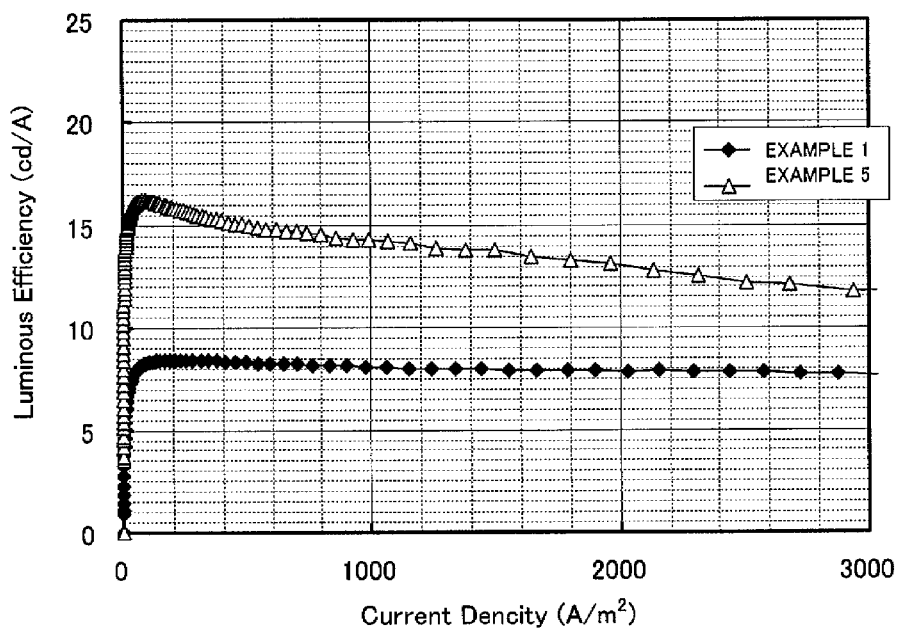
FIG. 21 is a graph illustrating the luminous efficiency-current densities obtained in the Example 1 and the Example 5.
Figure 22:
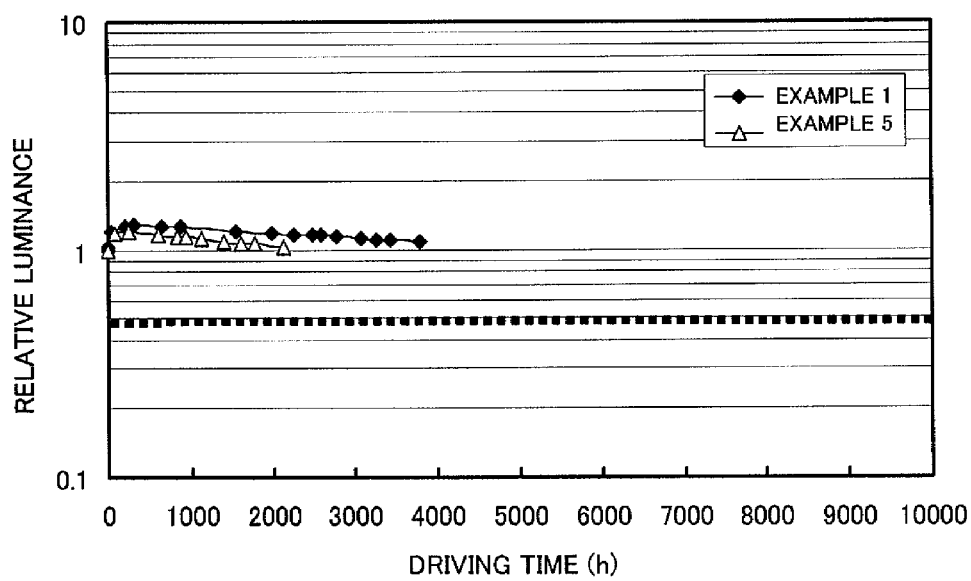
FIG. 22 is a graph illustrating the lifetime properties obtained in the Example 1 and the Example 5.

FIG. 20 and FIG. 21 respectively show the luminance-voltage properties and the luminous efficiency-current densities of the organic EL elements obtained in Examples 1 and 5, and FIG. 22 shows their lifetime properties.

From organic EL element obtained in Example 5, yellow emission derived from rubrene was observed. Luminous efficiency in the front luminance was 16.5 cd/A, and an external quantum calculated from the number of photons obtained by observing the light emission emitted to all angles and the number of electrons input was 5.0%. Further, when the organic EL element was driven at constant current density of 250 Å/m², the estimated time where the luminance dropped by half was 10,000 hours or more so that it was confirmed that its lifetime properties was excellent.

Example 6

Production of Organic EL Element

First, an ITO substrate having ITO patterned as an anode in line of 2 mm width on a glass substrate was prepared. A film of spiro-DPVBi and $MoO_3$ was formed by codeposition on the ITO substrate with the deposition at a ratio by weight of 67:33 under the condition of vacuum degree of $10^{-5}$ Pa so as the total film thickness became 10 nm at the deposition speed of 1.5 Å/sec. Thereby, a hole injecting layer was formed.

Next, spiro-DPVBi was formed on the hole injecting layer by vacuum depositing under the condition of vacuum degree of $10^{-5}$ Pa so as the film thickness became 10 nm at the deposition speed of 1.0 Å/sec. Thereby, a hole transporting layer was formed.

Next, a film was formed on the hole transporting layer using TBADN represented by the above formula (2) as the host material and rubrene represented by the above formula (3) as the light emitting dopant, which was the light emitting center, under the condition of vacuum degree of $10^{-5}$ Pa, so as the rubrene concentration of TBADN and rubrene became 1 wt % and the thickness of the film became 70 nm at the deposition speed of 1.0 Å/sec for TBADN. Thereby, a light emitting layer was formed.

Next, a film was formed on the light emitting layer by vacuum depositing spiro-DPVBi under the condition of vacuum degree of $10^{-5}$ Pa so as a film thickness became 20 nm at the deposition speed of 1.0 Å/sec. Thereby, an electron transporting layer was obtained.

Then, a film was formed on the electron transporting layer by codepositing spiro-DPVBi and Liq represented by the above formula (4) at a ratio by weight of 1:1 under the condition of vacuum degree of $10^{-5}$ Pa so as the film thickness became 12 nm at the deposition speed of 1.0 Å/sec. Thereby, an electron injecting layer was formed.

Lastly, Al was deposited on the electron injecting layer as a cathode to the film thickness of 100 nm at the deposition speed of 5.0 Å/sec. At this time, the Al film was formed in line via a shadow mask so as the Al film became orthogonal to the lines of the ITO and the emission area became 2 mm□.

Example 7

Production of Organic EL Element

An organic EL element was produced in the same manner as Example 6, except the light emitting layer was formed as follows.

A film was formed on the hole transporting layer using TBADN represented by the above formula (2) as the host material and rubrene represented by the above formula (3) as the light emitting dopant, which was the light emitting center, under the condition of vacuum degree of $10^{-5}$ Pa, so as the rubrene concentration of TBADN and rubrene became 1 wt % and the thickness of the film became 30 nm at the deposition speed of 1.0 Å/sec for TBADN. Then, the deposition speed of rubrene was speeded up so as the rubrene concentration went up from 1 wt % to 3 wt % and the film was formed into the thickness of 10 nm, and further, the film was formed into the thickness of 30 nm so as the rubrene concentration became 3 wt %. Thereby, a light emitting layer was formed.

Example 8

Production of Organic EL Element

An organic EL element was produced in the same manner as Example 6, except the light emitting layer was formed as follows.

A film was formed on the hole transporting layer using TBADN represented by the above formula (2) as the host material and rubrene represented by the above formula (3) as the light emitting dopant, which was the light emitting center, under the condition of vacuum degree of $10^{-5}$ Pa, so as the rubrene concentration of TBADN and rubrene became 3 wt % and the thickness of the film became 30 nm at the deposition speed of 1.0 Å/sec for TBADN. Then, the deposition speed of rubrene was slowed down so as the rubrene concentration went down from 3 wt % to 1 wt % and the film was formed into the thickness of 10 nm, and further, the film was formed into the thickness of 30 nm so as the rubrene concentration became 1 wt %. Thereby, a light emitting layer was formed.

Example 9

Production of Organic EL Element

An organic EL element was produced in the same manner as Example 6, except the light emitting layer was formed as follows.

A film was formed on the hole transporting layer using TBADN represented by the above formula (2) as the host material and rubrene represented by the above formula (3) as the light emitting dopant, which was the light emitting center, under the condition of vacuum degree of $10^{-5}$ Pa, so as the rubrene concentration of TBADN and rubrene became 3 wt % and the thickness of the film became 70 nm at the deposition speed of 1.0 Å/sec for TBADN. Thereby, a light emitting layer was formed.

(Evaluation)

Figure 23:
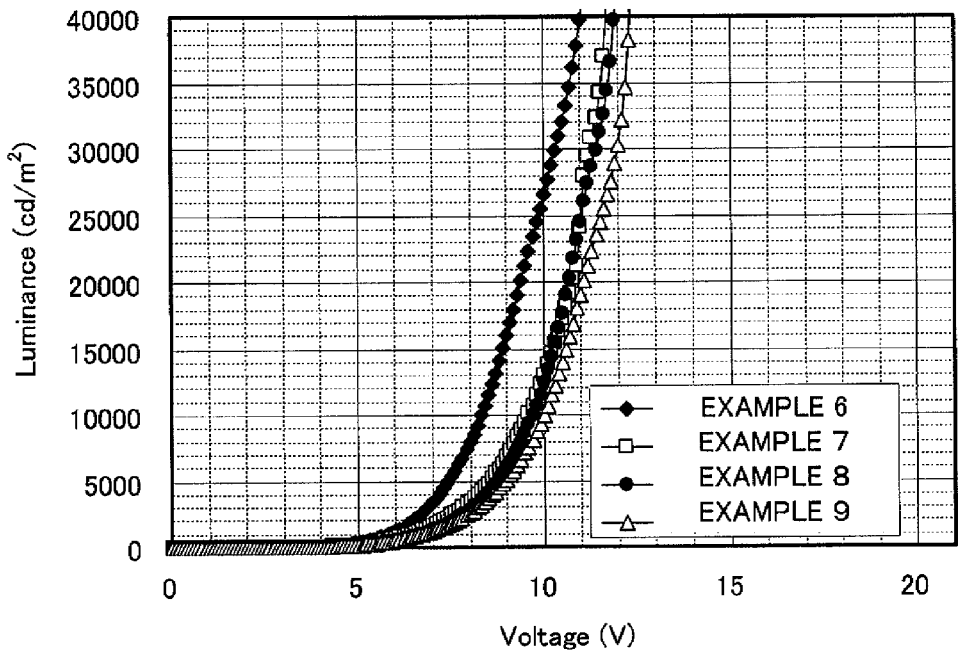
FIG. 23 is a graph illustrating the luminance-voltage properties obtained in the Example 6 to the Example 9.
Figure 24:
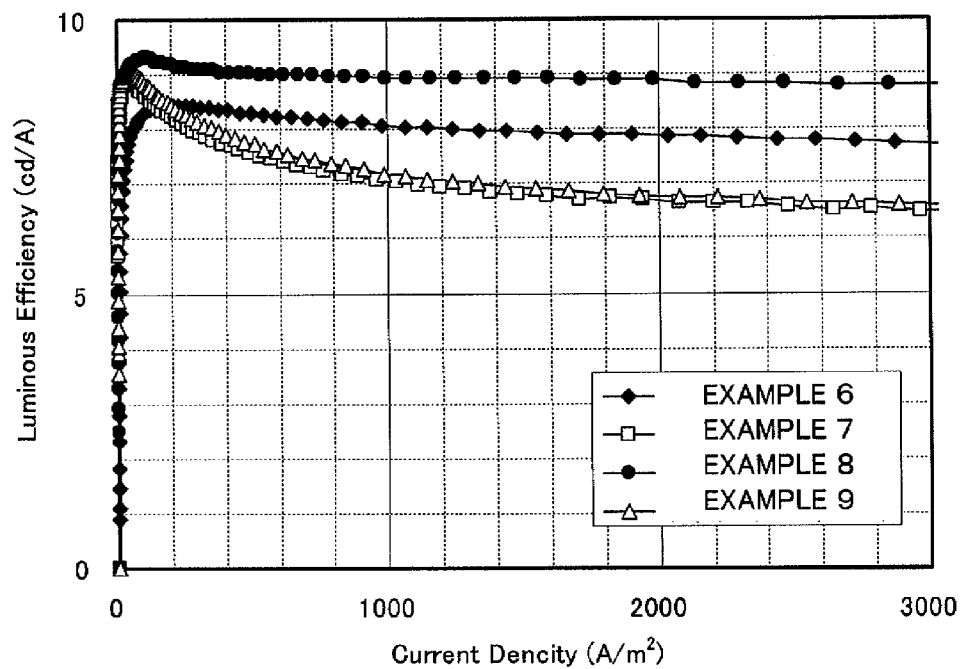
FIG. 24 is a graph illustrating the luminous efficiency-current densities obtained in the Example 6 to the Example 9.

FIG. 23 and FIG. 24 respectively show the luminance-voltage properties and the luminous efficiency-current density of the organic EL elements obtained in Examples 6 to 9. Table 2 shows luminous efficiency, external quantum, and lifetime of the organic EL elements obtained in Examples 6 to 9.

TABLE 2

| | Rubrene Concentration (wt %) | | Luminous Efficiency (cd/A) | External Quantum Yield (%) | Lifetime (Hour) |
|---|---|---|---|---|---|
| | Anode Side | Cathode Side | | | |
| Example 6 | 1 | 1 | 8.4 | 2.3 | 10,000 or longer |
| Example 7 | 1 | 3 | 8.8 | 2.5 | 10,000 or longer |
| Example 8 | 3 | 1 | 9.3 | 2.8 | 10,000 or longer |
| Example 9 | 3 | 3 | 9.0 | 2.5 | 10,000 or longer |

From the organic EL elements obtained in Examples 6 to 9, yellow emissions derived from rubrene were observed. Further, when the organic EL elements were driven at constant current density of 250 Å/m², all the organic EL elements obtained in Examples 6 to 9 maintained luminance retention of 100% or more for 3,700 hours, and the estimated time where the luminance dropped by half were 10,000 hours or longer. It was confirmed that, in the combination of the constituent materials for the hole injecting and transporting layer, light emitting layer, and electron injecting and transporting layer used in the Examples 6 to 9, the luminous efficiencies and the external quantum improved by making the concentration gradient of rubrene, which was light emitting dopant, higher at the anode side.

Example 10

Production of Organic EL Element

First, an ITO substrate having ITO patterned as an anode in line of 2 mm width on a glass substrate was prepared. A film of spiro-DPVBi and $MoO_3$ was formed by codeposition on the ITO substrate at a deposition by ratio by weight of 67:33 under the condition of vacuum degree of $10^{-5}$ Pa so as the total film thickness became 10 nm at the deposition speed of 1.5 Å/sec. Thereby, a hole injecting layer was formed.

Next, spiro-DPVBi was formed on the hole injecting layer by vacuum depositing under the condition of vacuum degree of $10^{-5}$ Pa so as the film thickness became 10 nm at the deposition speed of 1.0 Å/sec. Thereby, a hole transporting layer was formed.

A film was formed on the hole transporting layer using TBADN represented by the above formula (2) as the host material and rubrene represented by the above formula (3) and anthracenediamine represented by the above formula (7) as the light emitting dopant, which were the light emitting center, under the condition of vacuum degree of $10^{-5}$ Pa, so as the rubrene concentration of TBADN and rubrene became 1 wt % and the thickness of the film became 35 nm while also the anthracenediamine concentration of TBADN and anthracenediamine became 10 wt % and the thickness of the film became 35 nm, at the deposition speed of 1.0 Å/sec for TBADN. Thereby, a light emitting layer was formed.

Next, a film was formed on the light emitting layer by vacuum depositing spiro-DPVBi under the condition of vacuum degree of $10^1$Pa so as a film thickness became 20 nm at the deposition speed of 1.0 Å/sec. Thereby, an electron transporting layer was obtained.

Further next, a film was formed on the electron transporting layer by codepositing spiro-DPVBi and Liq represented by the above formula (4) at a ratio by weight of 1:1 under the condition of vacuum degree of $10^{-5}$ Pa so as the film thickness became 12 nm at the deposition speed of 1.0 Å/sec. Thereby, an electron injecting layer was formed.

Lastly, Al was deposited on the electron injecting layer as a cathode to the film thickness of 100 nm at the deposition speed of 5.0 Å/sec. At this time, the Al film was formed in line via a shadow mask so as the Al film became orthogonal to the lines of the ITO and the emission area became 2 mm□.

Example 11

Production of Organic EL Element

An organic EL element was produced in the same manner as Example 10, except the light emitting layer was formed as follows.

A film was formed on the hole transporting layer using TBADN represented by the above formula (2) as the host material and anthracenediamine represented by the above formula (7) as the light emitting dopant, which was the light emitting center, under the condition of vacuum degree of $10^{-5}$ Pa, so as the anthracenediamine concentration of TBADN and anthracenediamine became 10 wt % and the thickness of the film became 70 nm at the deposition speed of 1.0 Å/sec for TBADN. Thereby, a light emitting layer was formed.

(Evaluation)

Figure 25:
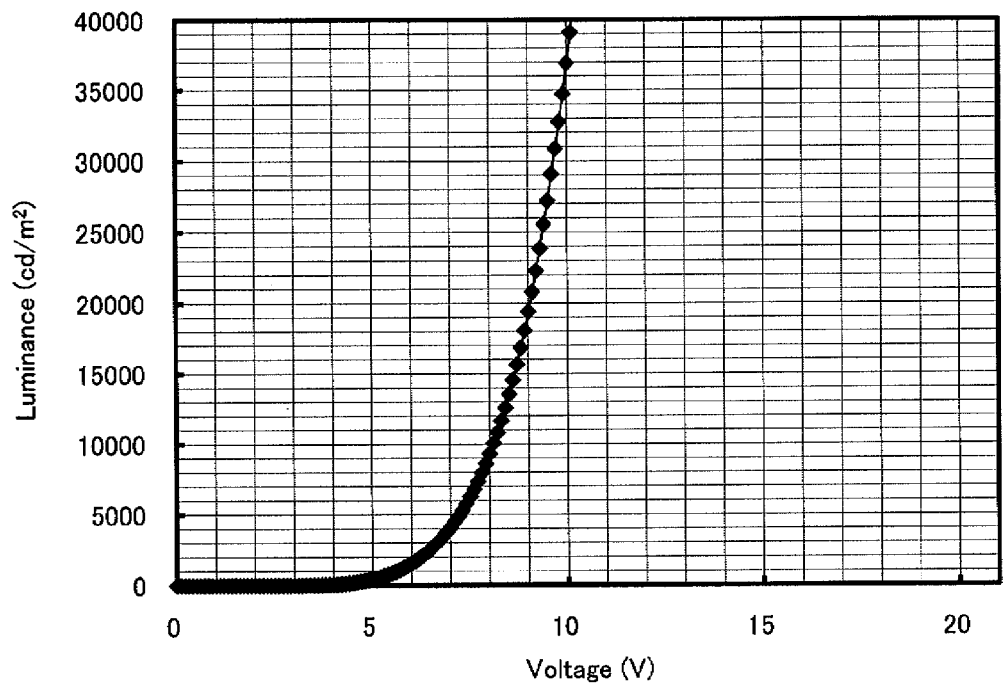
FIG. 25 is a graph illustrating the luminance-voltage properties obtained in the Example 10.
Figure 26:
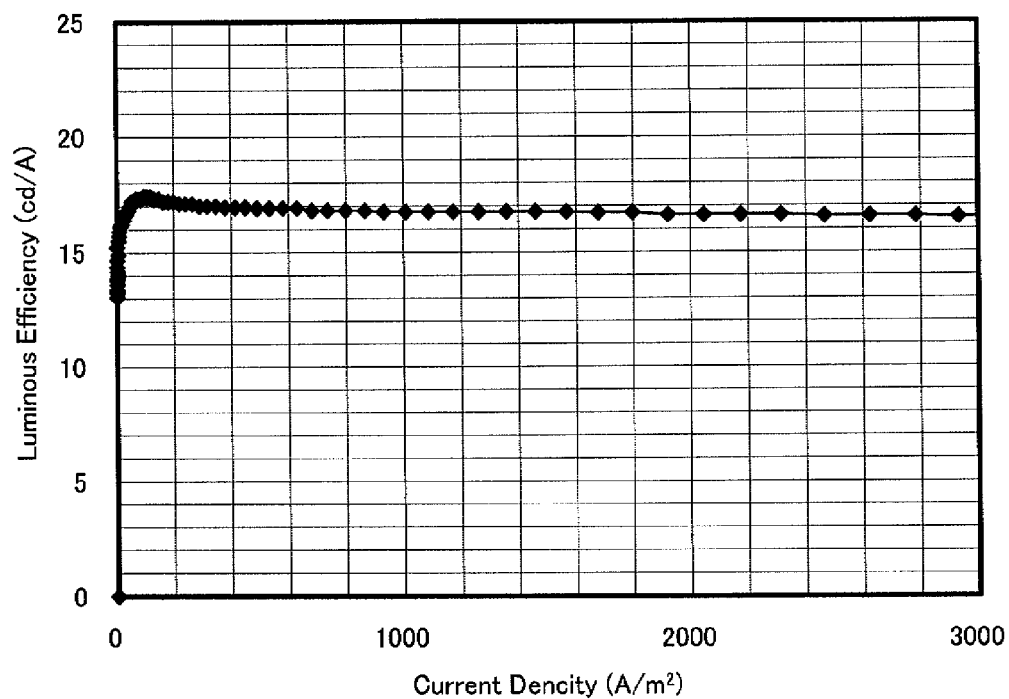
FIG. 26 is a graph illustrating the luminous efficiency-current densities obtained in the Example 10.
Figure 27:
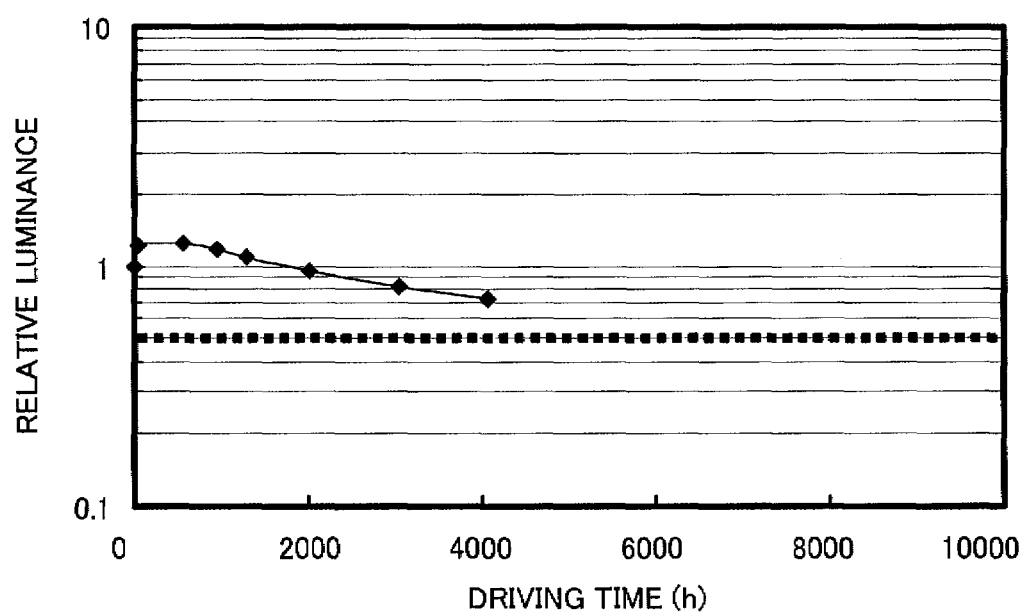
FIG. 27 is a graph illustrating the lifetime properties obtained in the Example 10.

FIG. 25 and FIG. 26 respectively show the luminance-voltage properties and the luminous efficiency-current density of the organic EL element obtained in Example 10, and FIG. 27 shoes the lifetime properties. Table 3 shows luminous efficiency, external quantum, lifetime of the organic EL elements obtained in Examples 6, 10 and 11.

TABLE 3

|  | Rubrene | | Anthracenediamine | | Luminous Efficiency (cd/A) | External Quantum Yield (%) | Lifetime (Hour) |
| --- | --- | --- | --- | --- | --- | --- | --- |
|  | Concentration (wt %) | Film Thickness (nm) | Concentration (wt %) | Film Thickness (nm) | | | |
| Example 10 | 1 | 35 | 10 | 35 | 17 | 4.7 | 8,000 |
| Example 11 | — | — | 10 | 70 | 15 | 4.6 | 6,000 |
| Example 6 | 1 | 70 | — | — | 8.4 | 2.3 | 10,000 or longer |

Excellent luminous efficiencies and external quantum were observed in the organic EL elements obtained in Examples 6, 10 and 11. Further, in terms of the lifetime properties of the organic EL element obtained in Example 10, when it was driven at constant current density of 250 Å/m², the estimated time where the luminance dropped by half was 8,000 hours or longer.

Example 12

Production of Organic EL Element

An organic EL element was produced in the same manner as Example 1, except the light emitting layer was formed as follows.

A film was formed by vacuum deposition on the hole transporting layer using BAlq (Bis-(2-methyl-8-quinolinolate)-4-(phenylphenolato)aluminium) represented by the below formula (8) as the host material and rubrene represented by the above formula (3) as the light emitting dopant, which was the light emitting center, under the condition of vacuum degree of $10^{-5}$ Pa, so as the rubrene concentration of BAlq and rubrene became 1 wt % and the thickness of the film became 70 nm at the deposition speed of 1.0 Å/sec. Thereby, a light emitting layer was formed.

[Chemical Formula 10]

(8)

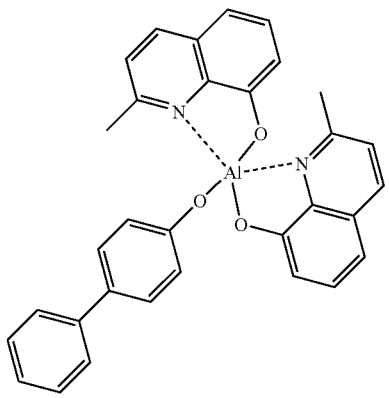

Example 13

Production of Organic EL Element

An organic EL element was produced in the same manner as Example 1, except the light emitting layer was formed as follows.

A film was formed by vacuum deposition on the hole transporting layer using CBP represented by the below formula (9) as the host material and rubrene represented by the above formula (3) as the light emitting dopant, which was the light emitting center, under the conditions of vacuum degree of $10^{-5}$ Pa, so as the rubrene concentration of CBP and rubrene became 1 wt % and the thickness of the film became 70 nm at the deposition speed of 1.0 Å/sec. Thereby, a light emitting layer was formed.

[Chemical Formula 11]

(9)

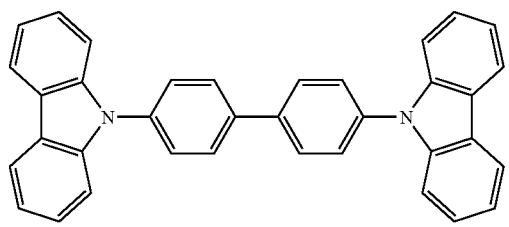

Example 14

Production of Organic EL Element

An organic EL element was produced in the same manner as Example 1, except the light emitting layer was formed as follows.

A film was formed by vacuum deposition on the hole transporting layer using spiro-6P represented by the below formula (10) as the host material and rubrene represented by the above formula (3) as the light emitting dopant, which was the light emitting center, under the condition of vacuum degree of $10^{-5}$ Pa, so as the rubrene concentration of spiro-6P and rubrene became 1 wt % and the thickness of the film became 70 nm at the deposition speed of 1.0 Å/sec. Thereby, a light emitting layer was obtained.

[Chemical Formula 12]

(10)

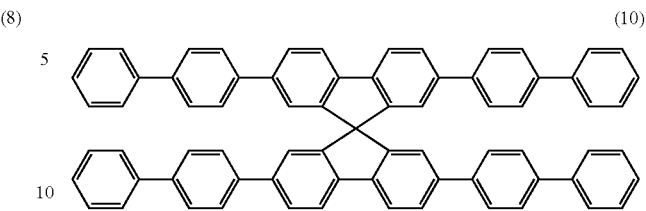

(Evaluation)

From organic EL elements obtained in Examples 12 to 14, yellow emissions derived from rubrene were observed. Table 4 shows luminous efficiencies in the front luminance, external quanta calculated from the number of photons obtained by observing the light emission emitted to all angles and the number of electrons input, and estimated times where the luminance dropped by half at constant current driving of 1 mA for the organic EL elements.

TABLE 4

|  | Host Material | Luminous Efficiency (cd/A) | External Quantum Yield (%) | Lifetime (Hour) |
| --- | --- | --- | --- | --- |
| Example 12 | BAlq | 8.1 | 2.4 | 7,000 |
| Example 13 | CBP | 7.2 | 2.4 | 2,100 |
| Example 14 | spiro-6P | 6.8 | 2.5 | 2,000 |

Example 15

Production of Organic EL Element

An organic EL element was produced in the same manner as Example 1, except the light emitting layer was formed as follows.

A film was formed by vacuum deposition on the hole transporting layer using TBADN represented by the above formula (2) as the host material and 2,5,8,11-Tetra-tert-butylperylene (TBPe) represented by the below formula (11) as the light emitting dopant, which was the light emitting center, under the condition of vacuum degree of $10^{-5}$ Pa, so as the TBPe concentration of TBADN and TBPe became 1 wt % and the thickness of the film became 70 nm at the deposition speed of 1.0 Å/sec. Thereby, a light emitting layer was obtained.

[Chemical Formula 13]

(11)

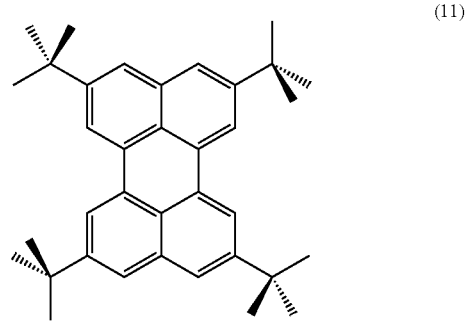

Example 16

Production of Organic EL Element

First, an ITO substrate having ITO patterned as an anode in line of 2 mm width on a glass substrate was prepared. A film of TBADN and $MoO_3$ was formed by codeposition on the ITO substrate with the deposition at a ratio by weight of 67:33 under the condition of vacuum degree of $10^{-5}$ Pa so as the total film thickness became 10 nm at the deposition speed of 1.5 Å/sec. Thereby, a hole injecting layer was formed.

Next, TBADN was formed on the hole injecting layer by vacuum depositing under the condition of vacuum degree of $10^{-5}$ Pa so as the film thickness became 10 nm at the deposition speed of 1.0 Å/sec. Thereby, a hole transporting layer was formed.

Next, a film was formed by vacuum deposition on the hole transporting layer using spiro-6P represented by the above formula (10) as the host material and TBPe represented by the above formula (11) as the light emitting dopant, which was the light emitting center, under the condition of vacuum degree of $10^{-5}$ Pa, so as the TBPe concentration of spiro-6P and TBPe became 1 wt % and the thickness of the film became 70 nm at the deposition speed of 1.0 Å/sec. Thereby, a light emitting layer was formed.

Next, a film was formed on the light emitting layer by vacuum depositing TBADN under the condition of vacuum degree of $10^{-5}$ Pa so as a film thickness became 10 nm at the deposition speed of 1.0 Å/sec. Thereby, an electron transporting layer was formed.

Further next, a film was formed on the electron transporting layer by codepositing TBADN and Liq represented by the above formula (4) at a ratio by weight of 1:1 under the condition of vacuum degree of $10^{-5}$ Pa so as the film thickness became 12 nm at the deposition speed of 1.0 Å/sec. Thereby, an electron injecting layer was formed.

Lastly, Al was deposited on the electron injecting layer as a cathode to the film thickness of 100 nm at the deposition speed of 5.0 Å/sec.

(Evaluation)

From organic EL elements obtained in Examples 15 and 16, blue emissions were observed. Table 5 shows luminous efficiencies in the front luminance, external quanta calculated from the number of photons obtained by observing the light emission emitted to all angles and the number of electrons input, and estimated times where the luminance dropped by half at constant current driving of 1 mA for the organic EL elements.

TABLE 5

|  | Luminous Efficiency (cd/A) | External Quantum Yield (%) | Lifetime (Hour) |
|---|---|---|---|
| Example 15 | 0.8 | 0.4 | 1,800 |
| Example 16 | 2.5 | 1.3 | 2,000 |

Example 17

Production of Organic EL Element

An organic EL element was produced in the same manner as Example 1, except the light emitting layer was formed as follows.

A film was formed by vacuum deposition on the hole transporting layer using TBADN represented by the above formula (2) as the host material and DCJTB represented by the below formula (12) as the light emitting dopant, which was the light emitting center, under the condition of vacuum degree of $10^{-5}$ Pa, so as the DCJTB concentration of TBADN and DCJTB became 1 wt % and the thickness of the film became 70 nm at the deposition speed of 1.0 Å/sec. Thereby, a light emitting layer was obtained.

[Chemical Formula 14]

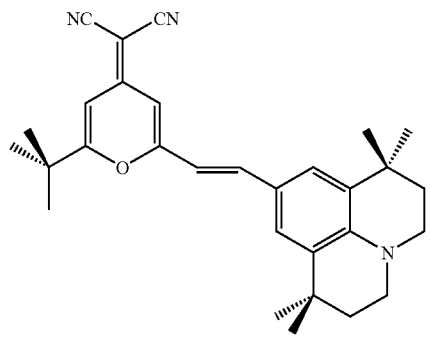

(12)

Example 18

Production of Organic EL Element

An organic EL element was produced in the same manner as Example 1, except the light emitting layer was formed as follows.

A film was formed by vacuum deposition on the hole transporting layer using TBADN represented by the above formula (2) as the host material and DCJTB represented by the above formula (12) and rubrene represented by the above formula (3) as the light emitting dopant, which was the light emitting center, under the conditions of vacuum degree of $10^{-5}$ Pa, so as both of the DCJTB concentration and rubrene concentration of TBADN, DCJTB and rubrene became 1 wt % and the thickness of the film became 70 nm at the deposition speed of 1.0 Å/sec. Thereby, a light emitting layer was obtained.

(Evaluation)

From organic EL elements obtained in Examples 17 and 18, red emissions derived from DCJTB were observed. Table 6 shows luminous efficiencies in the front luminance, external quanta calculated from the number of photons obtained by observing the light emission emitted to all angles and the number of electrons input, and estimated times where the luminance dropped by half at constant current driving of 1 mA for the organic EL elements.

The case in which DCJTB and rubrene were doped (Example 17) showed improved red properties compare to the case in which only DCJTB was doped (Example 16).

TABLE 6

| | Light Emitting Dopant | Luminous Efficiency (cd/A) | External Quantum Yield (%) | Lifetime (Hour) |
|---|---|---|---|---|
| Example 17 | DCJTB | 2.5 | 1.2 | 1,000 |
| Example 18 | DCJTB Rubrene | 3.5 | 1.5 | 2,000 |

Example 19

Production of Organic EL Element

An organic EL element was produced in the same manner as Example 1, except the light emitting layer was formed as follows.

Films were formed by vacuum deposition on the hole transporting layer using spiro-6P represented by the above formula (10) as the host material and TBPe represented by the above formula (11) and rubrene represented by the above formula (3) as the light emitting dopant, which was the light emitting center, under the condition of vacuum degree of $10^{-5}$ Pa, so as: the TBPe concentration of spiro-6P and TBPe became 1 wt % and the thickness of the film became 35 nm at the deposition speed of 1.0 Å/sec for the first film; and the rubrene concentration of spiro-6P and rubrene became 1 wt % and the thickness of the film became 35 nm at the deposition speed of 1.0 Å/sec for the next film. Thereby, a light emitting layer was obtained.

(Evaluation)

From organic EL element obtained in Example 19, white emission derived from TBPe and rubrene was observed. In this organic EL element obtained, luminous efficiency in the front luminance was 8.0 cd/A, and an external quantum was 3.0%, and the time where the luminance dropped by half at constant current driving of 1 mA was 2,000 hours.

Example 10

An organic EL element was produced in the same manner as Example 1, except the light emitting layer was formed as follows.

A film was formed by vacuum deposition on the hole transporting layer using CBP represented by the above formula (9) as the host material and Ir(piq)$_3$ represented by the below formula (13) as the light emitting dopant under the condition of vacuum degree of $10^{-5}$ Pa, so as the Ir(piq)$_3$ concentration of CBP and Ir(piq)$_3$ became 5 wt % and the thickness of the film became 70 nm at the deposition speed of 1.0 Å/sec. Thereby, a light emitting layer was obtained.

[Chemical Formula 15]

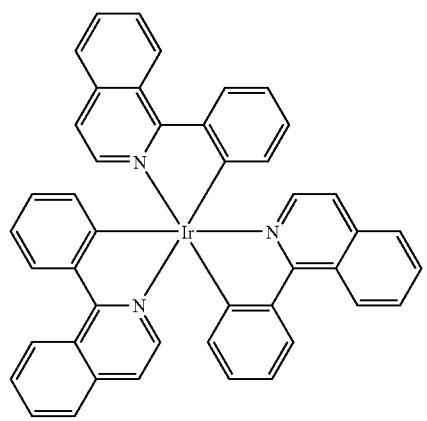

(13)

(Evaluation)

In this organic EL element obtained, luminous efficiency in the front luminance was 5.0 cd/A, and an external quantum was 5.0%, and the lifetime where the element started its emission at 1000 cd/m² was 2,000 hours.

The invention claimed is:

1. An organic electroluminescence element comprising:
an anode,
a hole injecting and transporting layer formed on the anode,
a light emitting layer formed on the hole injecting and transporting layer,
an electron injecting and transporting layer formed on the light emitting layer, and
a cathode formed on the electron injecting and transporting layer,
wherein a relation of $Ip_2 \geq Ip_3$ is established when an ionization potential of a constituent material for the light emitting layer is $Ip_2$ and an ionization potential of a constituent material for the electron injecting and transporting layer is $Ip_3$, and
a relation of $Ea_1 = Ea_2$ is established when an electron affinity of the constituent material for the hole injecting and transporting layer is $Ea_1$ and an electron affinity of the constituent material for the light emitting layer is $Ea_2$,
wherein a second hole injecting and transporting layer is formed between the hole injecting and transporting layer and the light emitting layer,
wherein a relation of $Ea_1 = Ea_4 = Ea_2$ is established when an electron affinity of a constituent material for the second hole injecting and transporting layer is $Ea_4$, and
a relation of $Ip_1 < Ip_4 < Ip_2$ is established when an ionization potential of the constituent material for the second hole injecting and transporting layer is $Ip_4$ and an ionization potential of the constituent material for the hole injecting and transporting layer is $Ip_1$, and
wherein the constituent material for the hole injecting and transporting layer, the constituent material for the light emitting layer, and the constituent material for the second hole injecting and transporting layer are different materials.

2. The organic electroluminescence element according to claim 1, wherein each of the hole injecting and transporting layer and the electron injecting and transporting layer comprise a bipolar material which can transport a hole and an electron.

3. The organic electroluminescence element according to claim 1, wherein the hole injecting and transporting layer has a region where an oxidizing dopant is mixed into an organic compound for the hole injecting and transporting layer at an interface to at least the anode, and
wherein the electron injecting and transporting layer has a region where a reducing dopant is mixed into an organic compound for the electron injecting and transporting layer at an interface to at least the cathode.

4. The organic electroluminescence element according to claim 1, wherein the light emitting layer comprises a host material and a light emitting dopant, and wherein the light emitting dopant contained in the light emitting layer has distribution in its concentration.

5. The organic electroluminescence element according to claim 1, wherein the light emitting layer comprises a host material and at least two light emitting dopants.

6. An organic electroluminescence element comprising:
plural light emitting units, which respectively having a hole injecting and transporting layer, a light emitting layer and an electron injecting and transporting layer sequentially laminated, between an anode and a cathode facing each other; and
a charge generating layer formed between adjacent light emitting units, wherein a relation of $Ip_2 \geq Ip_3$ is established when an ionization potential of a constituent material for the light emitting layer is $Ip_2$ and an ionization potential of a constituent material for the electron injecting and transporting layer is $Ip_3$, and a relation of $Ea_1=Ea_2$ is established when an electron affinity of a constituent material for the hole injecting and transporting layer is $Ea_1$ and an electron affinity of the constituent material for the light emitting layer is $Ea_2$, wherein a second hole injecting and transporting layer is formed between the hole injecting and transporting layer and the light emitting layer, and wherein a relation of $Ea_1=Ea_4=Ea_2$ is established when an electron affinity of a constituent material for the second hole injecting and transporting layer is $Ea_4$, and a relation of $Ip_1<Ip_4<Ip_2$ is established when an ionization potential of the constituent material for the second hole injecting and transporting layer is $Ip_4$ and an ionization potential of the constituent material for the hole injecting and transporting layer is $Ip_1$, and wherein the constituent material for the hole injecting and transporting layer, the constituent material for the light emitting layer, and the constituent material for the second hole injecting and transporting layer are different materials.

7. The organic electroluminescence element according to claim 6, wherein each of the hole injecting and transporting layer and the electron injecting and transporting layer comprise a bipolar material which can transport a hole and an electron.

8. The organic electroluminescence element according to claim 6, wherein the hole injecting and transporting layer has a region where an oxidizing dopant is mixed into an organic compound for the hole injecting and transporting layer at an interface to at least the anode or at an interface to at least the anode and the charge generating layer, and wherein the electron injecting and transporting layer has a region where a reducing dopant is mixed into an organic compound for the electron injecting and transporting layer at an interface to at least the cathode or at an interface to at least the cathode and the charge generating layer.

9. The organic electroluminescence element according to claim 6, wherein the light emitting layer comprises a host material and a light emitting dopant, and wherein the light emitting dopant contained in the light emitting layer has distribution in its concentration.

10. The organic electroluminescence element according to claim 6, wherein the light emitting layer comprises a host material and at least two light emitting dopants.

11. An organic electroluminescence element comprising:
an anode,
a hole injecting and transporting layer formed on the anode,
a light emitting layer formed on the hole injecting and transporting layer,
an electron injecting and transporting layer formed on the light emitting layer, and
a cathode formed on the electron injecting and transporting layer,
wherein a relation of $Ip_2=Ip_3$ is established when an ionization potential of a constituent material for the light emitting layer is $Ip_2$ and an ionization potential of a constituent material for the electron injecting and transporting layer is $Ip_3$, and
a relation of $Ea_1 \geq Ea_2$ is established when an electron affinity of a constituent material for the hole injecting and transporting layer is $Ea_1$ and an electron affinity of the constituent material for the light emitting layer is $Ea_2$,
wherein a second electron injecting and transporting layer is formed between the electron injecting and transporting layer and the light emitting layer,
wherein a relation of $Ip_2=Ip_5=Ip_3$ is established when an ionization potential of a constituent material for the second electron injecting and transporting layer is $Ip_5$, and
a relation of $Ea_2<Ea_5<Ea_3$ is established when an electron affinity of the constituent material for the second electron injecting and transporting layer is $Ea_5$ and an electron affinity of the constituent material for the electron injecting and transporting layer is $Ea_3$, and
wherein the constituent material for the light emitting layer, the constituent material for the electron injecting and transporting layer, and the constituent material for the second electron injecting and transporting layer are different materials.

12. The organic electroluminescence element according to claim 11, wherein each of the hole injecting and transporting layer and the electron injecting and transporting layer comprise a bipolar material which can transport a hole and an electron.

13. The organic electroluminescence element according to claim 11, wherein the hole injecting and transporting layer has a region where an oxidizing dopant is mixed into an organic compound for the hole injecting and transporting layer at an interface to at least the anode, and wherein the electron injecting and transporting layer has a region where a reducing dopant is mixed into an organic compound for the electron injecting and transporting layer at an interface to at least the cathode.

14. The organic electroluminescence element according to claim 11, wherein the light emitting layer comprises a host material and a light emitting dopant, and wherein the light emitting dopant contained in the light emitting layer has distribution in its concentration.

15. The organic electroluminescence element according to claim 11, wherein the light emitting layer comprises a host material and at least two light emitting dopants.

16. An organic electroluminescence element comprising:
plural light emitting units, which respectively having a hole injecting and transporting layer, a light emitting layer and an electron injecting and transporting layer sequentially laminated, between an anode and a cathode facing each other; and
a charge generating layer formed between adjacent light emitting units,
wherein a relation of $Ip_2=Ip_3$ is established when an ionization potential of a constituent material for the light emitting layer is $Ip_2$ and an ionization potential of a constituent material for the electron injecting and transporting layer is $Ip_3$, and
a relation of $Ea_1 \geq Ea_2$ is established when an electron affinity of a constituent material for the hole injecting and transporting layer is $Ea_1$ and an electron affinity of the constituent material for the light emitting layer is $Ea_2$,
wherein a second electron injecting and transporting layer is formed between the electron injecting and transporting layer and the light emitting layer,
wherein a relation of $Ip_2=Ip_5=Ip_3$ is established when an ionization potential of a constituent material for the second electron injecting and transporting layer is $Ip_5$, and
a relation of $Ea_2<Ea_5<Ea_3$ is established when an electron affinity of the constituent material for the second electron injecting and transporting layer is $Ea_5$ and an electron affinity of the constituent material for the electron injecting and transporting layer is $Ea_3$, and wherein the constituent material for the light emitting layer, the constituent material for the electron injecting and transporting layer, and the constituent material for the second electron injecting and transporting layer are different materials.

17. The organic electroluminescence element according to claim 16, wherein each of the hole injecting and transporting layer and the electron injecting and transporting layer comprise a bipolar material which can transport a hole and an electron.

18. The organic electroluminescence element according to claim 16, wherein the hole injecting and transporting layer has a region where an oxidizing dopant is mixed into an organic compound for the hole injecting and transporting layer at an interface to at least the anode or at an interface to at least the anode and the charge generating layer, and wherein the electron injecting and transporting layer has a region where a reducing dopant is mixed into an organic compound for the electron injecting and transporting layer at an interface to at least the cathode or at an interface to at least the cathode and the charge generating layer.

19. The organic electroluminescence element according to claim 16, wherein the light emitting layer comprises a host material and a light emitting dopant, and wherein the light emitting dopant contained in the light emitting layer has distribution in its concentration.

20. The organic electroluminescence element according to claim 16, wherein the light emitting layer comprises a host material and at least two light emitting dopants.

* * * * *